(12) United States Patent
Das et al.

(10) Patent No.: US 9,881,904 B2
(45) Date of Patent: Jan. 30, 2018

(54) MULTI-LAYER SEMICONDUCTOR DEVICES FABRICATED USING A COMBINATION OF SUBSTRATE AND VIA STRUCTURES AND FABRICATION TECHNIQUES

(71) Applicant: Massachusetts Institute of Technology, Cambridge, MA (US)

(72) Inventors: Rabindra N. Das, Lexington, MA (US); Mark A. Gouker, Belmont, MA (US); Pascale Gouker, Lexington, MA (US); Leonard M. Johnson, Carlisle, MA (US); Ryan C. Johnson, Woburn, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/303,800

(22) PCT Filed: Nov. 5, 2015

(86) PCT No.: PCT/US2015/059181
§ 371 (c)(1),
(2) Date: Oct. 13, 2016

(87) PCT Pub. No.: WO2016/118209
PCT Pub. Date: Jul. 28, 2016

(65) Prior Publication Data
US 2017/0040296 A1   Feb. 9, 2017

Related U.S. Application Data

(60) Provisional application No. 62/075,318, filed on Nov. 5, 2014.

(51) Int. Cl.
*H01L 25/065* (2006.01)
*H01L 23/373* (2006.01)
(Continued)

(52) U.S. Cl.
CPC ...... *H01L 25/0657* (2013.01); *H01L 23/3736* (2013.01); *H01L 23/481* (2013.01);
(Continued)

(58) Field of Classification Search
CPC . H01L 25/0657; H01L 25/50; H01L 23/3736; H01L 23/481; H01L 23/5226;
(Continued)

(56) References Cited

U.S. PATENT DOCUMENTS 4,316,200 A   2/1982   Ames et al.
4,612,083 A   9/1986   Yasumoto et al.
(Continued)

FOREIGN PATENT DOCUMENTS

WO   WO 2016/025451 A1   2/2016
WO   WO 2016/025478 A1   2/2016
(Continued)

OTHER PUBLICATIONS

U.S. Appl. No. 15/342,478, filed Nov. 3, 2016, Oliver, et al.
(Continued)

*Primary Examiner* — Cuong Q Nguyen
*Assistant Examiner* — Tong-Ho Kim
(74) *Attorney, Agent, or Firm* — Daly, Crowley, Mofford & Durkee, LLP

(57) ABSTRACT

A multi-layer semiconductor device includes two or more semiconductor sections, each of the semiconductor sections including at least at least one device layer having first and second opposing surfaces and a plurality of electrical connections extending between the first and second surfaces. The electrical connections correspond to first conductive structures. The multi-layer semiconductor device also includes one or more second conductive structures which are provided as through oxide via (TOV) or through insulator via (TIV) structures. The multi-layer semiconductor device
(Continued)

additionally includes one or more silicon layers. At least a first one of the silicon layers includes at least one third conductive structure which is provided as a through silicon via (TSV) structure. The multi-layer semiconductor device further includes one or more via joining layers including at least one fourth conductive structure. A corresponding method for fabricating a multi-layer semiconductor device is also provided.

28 Claims, 9 Drawing Sheets

(51) Int. Cl.
| | |
|---|---|
| H01L 23/532 | (2006.01) |
| H01L 25/00 | (2006.01) |
| H01L 23/48 | (2006.01) |
| H01L 23/522 | (2006.01) |
| H01L 23/528 | (2006.01) |
| H01L 23/535 | (2006.01) |
| H01L 27/06 | (2006.01) |

(52) U.S. Cl.
CPC ...... *H01L 23/5226* (2013.01); *H01L 23/5283* (2013.01); *H01L 23/535* (2013.01); *H01L 23/53209* (2013.01); *H01L 23/53238* (2013.01); *H01L 25/50* (2013.01); *H01L 27/0688* (2013.01); *H01L 2224/16145* (2013.01); *H01L 2225/06517* (2013.01); *H01L 2225/06524* (2013.01); *H01L 2225/06527* (2013.01); *H01L 2225/06541* (2013.01); *H01L 2225/06548* (2013.01); *H01L 2225/06572* (2013.01)

(58) Field of Classification Search
CPC .......... H01L 23/5283; H01L 23/53209; H01L 23/53238; H01L 23/535; H01L 27/0688; H01L 2224/16145; H01L 2225/06517; H01L 2225/06524; H01L 2225/06527; H01L 2225/06541; H01L 2225/06548; H01L 2225/06572
USPC ................ 257/621, 686, 774; 438/109, 124
See application file for complete search history.

(56) References Cited

U.S. PATENT DOCUMENTS

| | | | |
|---|---|---|---|
| 5,057,877 A | 10/1991 | Briley et al. | |
| 5,156,997 A | 10/1992 | Kumar et al. | |
| 5,371,328 A | 12/1994 | Gutierrez et al. | |
| 5,773,875 A | 6/1998 | Chan | |
| 6,108,214 A | 8/2000 | Fuse | |
| 6,297,551 B1 | 10/2001 | Dudderar et al. | |
| 6,324,755 B1 | 12/2001 | Borkowski et al. | |
| 6,355,501 B1 | 3/2002 | Fung et al. | |
| 6,396,371 B2 | 5/2002 | Streeter et al. | |
| 6,436,740 B1 | 8/2002 | Jen et al. | |
| 6,485,565 B1 | 11/2002 | Springer | |
| 6,819,000 B2 | 11/2004 | Magerlein et al. | |
| 6,825,534 B2 | 11/2004 | Chen et al. | |
| 6,838,774 B2 | 1/2005 | Patti | |
| 7,427,803 B2 | 9/2008 | Chao et al. | |
| 7,589,390 B2 | 9/2009 | Yao | |
| 7,624,088 B2 | 11/2009 | Johnson et al. | |
| 7,932,515 B2 | 4/2011 | Bunyk | |
| 7,939,926 B2 | 5/2011 | Kaskoun et al. | |
| 8,202,785 B2 | 6/2012 | Castex et al. | |
| 8,354,746 B2 | 1/2013 | Huang et al. | |
| 8,466,036 B2 | 6/2013 | Brindle et al. | |
| 8,487,444 B2 | 7/2013 | Law et al. | |
| 8,492,911 B2 | 7/2013 | Bachman et al. | |
| 8,519,543 B1 | 8/2013 | Song et al. | |
| 8,546,188 B2 | 10/2013 | Liu et al. | |
| 8,564,955 B2 | 10/2013 | Schmidt et al. | |
| 8,736,068 B2 | 5/2014 | Bartley et al. | |
| 8,754,321 B2 | 6/2014 | Schroeder et al. | |
| 8,828,860 B2 | 9/2014 | Gruber et al. | |
| 8,928,128 B2 | 1/2015 | Karikalan et al. | |
| 8,954,125 B2 | 2/2015 | Corcoles Gonzalez et al. | |
| 9,076,658 B1 | 7/2015 | Brown et al. | |
| 9,171,792 B2 | 10/2015 | Sun et al. | |
| 2001/0016383 A1* | 8/2001 | Chen ................ | H01L 21/76264 438/243 |
| 2002/0094661 A1 | 7/2002 | Enquist et al. | |
| 2003/0067073 A1 | 4/2003 | Akram et al. | |
| 2004/0124538 A1 | 7/2004 | Reif et al. | |
| 2004/0188845 A1 | 9/2004 | Iguchi et al. | |
| 2007/0087544 A1 | 4/2007 | Chang et al. | |
| 2007/0207592 A1 | 9/2007 | Lu et al. | |
| 2008/0093747 A1 | 4/2008 | Enquist et al. | |
| 2008/0122115 A1 | 5/2008 | Popa et al. | |
| 2008/0169559 A1 | 7/2008 | Yang | |
| 2008/0230916 A1 | 9/2008 | Saito et al. | |
| 2008/0290790 A1 | 11/2008 | Jin | |
| 2009/0078966 A1 | 3/2009 | Asai et al. | |
| 2009/0173936 A1 | 7/2009 | Bunyk | |
| 2009/0186446 A1 | 7/2009 | Kwon et al. | |
| 2009/0233436 A1 | 9/2009 | Kim et al. | |
| 2010/0001399 A1 | 1/2010 | Topacio | |
| 2010/0130016 A1 | 5/2010 | DeVilliers | |
| 2010/0148371 A1* | 6/2010 | Kaskoun ........... | H01L 21/76898 257/777 |
| 2010/0171093 A1 | 7/2010 | Kabir | |
| 2011/0049675 A1 | 3/2011 | Nagai et al. | |
| 2011/0140271 A1 | 6/2011 | Daubenspeck et al. | |
| 2011/0189820 A1 | 8/2011 | Sasaki et al. | |
| 2011/0204505 A1* | 8/2011 | Pagaila ................ | H01L 21/568 257/686 |
| 2011/0237069 A1 | 9/2011 | Miyazaki | |
| 2011/0248396 A1* | 10/2011 | Liu ..................... | H01L 25/0657 257/686 |
| 2012/0074585 A1* | 3/2012 | Koo ...................... | H01L 21/486 257/774 |
| 2012/0217642 A1 | 8/2012 | Sun et al. | |
| 2012/0228011 A1 | 9/2012 | Chang et al. | |
| 2012/0231621 A1 | 9/2012 | Chang et al. | |
| 2012/0252189 A1 | 10/2012 | Sadaka et al. | |
| 2012/0292602 A1 | 11/2012 | Guo et al. | |
| 2013/0029848 A1 | 1/2013 | Gonzalez et al. | |
| 2013/0093104 A1 | 4/2013 | Wu et al. | |
| 2013/0099235 A1 | 4/2013 | Han | |
| 2013/0147036 A1* | 6/2013 | Choi ................. | H01L 21/76898 257/737 |
| 2013/0153888 A1 | 6/2013 | Inoue et al. | |
| 2013/0187265 A1 | 7/2013 | Shih et al. | |
| 2013/0244417 A1 | 9/2013 | Markunas et al. | |
| 2014/0001604 A1 | 1/2014 | Sadaka | |
| 2014/0065771 A1 | 3/2014 | Gruber et al. | |
| 2014/0113828 A1 | 4/2014 | Gilbert et al. | |
| 2014/0246763 A1 | 9/2014 | Bunyk | |
| 2014/0264890 A1 | 9/2014 | Breuer et al. | |
| 2015/0041977 A1 | 2/2015 | Daubenspeck et al. | |
| 2015/0054151 A1 | 2/2015 | Choi et al. | |
| 2015/0054167 A1 | 2/2015 | Pendse | |
| 2015/0054175 A1 | 2/2015 | Meinhold et al. | |

FOREIGN PATENT DOCUMENTS

| | | |
|---|---|---|
| WO | WO 2016/073049 A1 | 5/2016 |
| WO | WO 2016/118209 A2 | 7/2016 |
| WO | WO 2016/118210 A2 | 7/2016 |
| WO | WO 2017/015432 A1 | 1/2017 |

OTHER PUBLICATIONS

U.S. Appl. No. 15/342,589, filed Nov. 3, 2016, Oliver, et al.
U.S. Appl. No. 15/342,444, filed Nov. 3, 2016, Oliver, et al.
U.S. Appl. No. 15/342,517, filed Nov. 3, 2016, Oliver, et al.

(56) References Cited

OTHER PUBLICATIONS

Ohya, et al.; "Room Temperature Deposition of Sputtered TiN Films for Superconducting Coplaner Waveguide Resonators;" IOP Publishing—Superconductor Science and Technology; vol. 27; Mar. 26, 2014; 10 pages.
Tarnlowy, et al.; "The Effect of Thermal Treatment on the Structure, Optical and Electrical Properties of Amorphous Titanium Nitride Thin Films;" Thin Solid Films 311; 1997; 8 pages.
PCT Search Report of the ISA for PCT/US2016/052824 dated Feb. 3, 2017; 6 pages.
PCT Written Opinion of the ISA for PCT/US2016/052824 dated Feb. 3, 2017; 6 pages.
PCT Search Report of the ISA for PCT/US2016/043266 dated Dec. 5, 2016; 5 pages.
PCT Written Opinion of the ISA for PCT/US2016/043266 dated Dec. 5, 2016; 9 pages.
Office Action dated Mar. 3, 2017 for U.S. Appl. No. 14/694,540; dated 16 pages.
U.S. Appl. No. 15/312,063, filed Nov. 17, 2016, Das, et al.
International Preliminary Report dated Feb. 23, 2017 for PCT Application No. PCT/US2015/044608; 9 pages.
International Preliminary Report dated Feb. 23, 2017 for PCT Application No. PCT/US2015/044679; 9 pages.
International Preliminary Report dated Feb. 23, 2017 for PCT Application No. PCT/US2015/044651; 10 pages.
U.S. Appl. No. 14/694,540, filed Apr. 23, 2015, Das, et al.
U.S. Appl. No. 15/271,755, filed Sep. 21, 2016, Das.
PCT Search Report of the ISA for PCT Appl. No. PCT/US2015/059181 dated Sep. 7, 2016; 5 pages.
PCT Written Opinion of the ISA for PCT Appl. No. PCT/US2015/059181 dated Sep. 7, 2016; 12 pages.
PCT Search Report of the ISA for PCT Appl. No. PCT/US2015/059200 dated Jul. 21, 2016; 3 pages.
PCT Written Opinion of the ISA for PCT Appl. No. PCT/US2015/059200 dated Jul. 21, 2016; 13 pages.
PCT Search Report of the ISA for PCT Appl. No. PCT/US2015/044608 dated Dec. 31, 2015; 5 pages.
PCT Written Opinion of the ISA for PCT Appl. No. PCT/US2015/044608 dated Dec. 31, 2015; 7 pages.
PCT Search Report of the ISA for PCT Appl. No. PCT/US2015/044679 dated Apr. 13, 2016; 3 pages.
PCT Written Opinion of the ISA for PCT Appl. No. PCT/US2015/044679 dated Apr. 13, 2016; 7 pages.
PCT Search Report of the ISA for PCT Appl. No. PCT/US2015/044651 dated Nov. 4, 2015; 3 pages.
PCT Search Report of the ISA for PCT Appl. No. PCT/US2015/044651 dated Nov. 4, 2015; 12 pages.
PCT International Search Report of the ISA for Appl. No. PCT/US2016/060263 dated Jan. 10, 2017; 3 pages.
PCT Written Opinion of the ISA for Appl. No. PCT/US2016/060263 dated Jan. 10, 2017; 6 pages.
Burns, et al.; "3D Circuit Integration Technology for Multiproject Fabrication;" MIT Lincoln Laboratory Presentation; Apr. 7, 2000; 15 pages.
Courtland; "Google Aims for Quantum Computing Supremacy;" Spectrum.IEEE.Org; North America; Jun. 2017; 2 pages.
International Search Report of the ISA for PCT Appl. No. PCT/US2016/060343 dated Jul. 18, 2017; 3 pages.
International Written Opinion of the ISA for PCT Appl. No. PCT/US2016/060343 dated Jan. 18, 2017; 12 pages.
Notice of Allowance for U.S. Appl. No. 15/327,235 dated Jun. 30, 2017; 17 pages.
Notice of Allowance for U.S. Appl. No. 14/694,540 dated Jul. 31, 2017; 9 pages.
Notice of Allowance for U.S. Appl. No. 15/312,063 dated Aug. 2, 2017; 17 pages.
Office Action dated Jul. 7, 2017 for U.S. Appl. No. 15/271,755; 26 pages.
Response to Office Action dated Mar. 3, 2017 for U.S. Appl. No. 14/694,540, filed Jun. 1, 2017; 24 pages.
Response to Restriction Requirement dated May 16, 2017 for U.S. Appl. No. 15/327,249, filed Jun. 27, 2017; 1 page.
Response to Restriction Requirement dated Jun. 8, 2017 for U.S. Appl. No. 15/271,755, filed Jun. 19, 2017; 1 page.
PCT Search Report of the ISA for PCT/US2016/060296 dated Mar. 10, 2017; 5 pages.
PCT Written Opinion of the ISA for PCT/US2016/060296 dated Mar. 10, 2017; 5 pages.
PCT Search Report of the ISA for PCT/US2016/060309 dated Mar. 24, 2017; 6 pages.
PCT Written Opinion of the ISA for PCT/US2016/060309 dated Mar. 24, 2017; 10 pages.
Restriction Requirement dated Apr. 28, 2017 for U.S. Appl. No. 15/342,444; 9 pages.
Response to Restriction Requirement and Preliminary Amendment dated Apr. 28, 2017 for U.S. Appl. No. 15/342,444, filed May 19, 2017; 6 pages.
Restriction Requirement dated May 16, 2017 for U.S. Appl. No. 15/327,249; 6 pages.
PCT International Preliminary Report on Patentability dated May 18, 2017 for PCT Appl. No. PCT/US2015/059181; 11 pages.
PCT International Preliminary Report on Patentability dated May 18, 2017 for PCT Appl. No. PCT/US2015/059200; 11 pages.
Office Action dated Aug. 11, 2017 for U.S. Appl. No. 15/342,444; 22 pages.
U.S. Appl. No. 15/684,269, dated Aug. 23, 2017, Das, et al.
U.S. Appl. No. 15/684,337, dated Aug. 23, 2017, Das, et al.
U.S. Appl. No. 15/684,393, dated Aug. 23, 2017, Das, et al.
Restriction Requirements for U.S. Appl. No. 15/271,755 dated Jun. 8, 2017; 6 pages.
Response to Jul. 7, 2017 Office Action for U.S. Appl. No. 15/271,755, filed Oct. 10, 2017; 33 pages.
Response to Aug. 11, 2017 Office Action for U.S. Appl. No. 15/342,444, filed Sep. 15, 2017; 20 pages.

* cited by examiner

MULTI-LAYER SEMICONDUCTOR DEVICES FABRICATED USING A COMBINATION OF SUBSTRATE AND VIA STRUCTURES AND FABRICATION TECHNIQUES

CROSS REFERENCE TO RELATED APPLICATIONS

This application is a U.S. National Stage of PCT application PCT/US2015/059181 filed in the English language on Nov. 5, 2015, and entitled "MULTI-LAYER SEMICONDUCTOR DEVICES FABRICATED USING A COMBINATION OF SUBSTRATE AND VIA STRUCTURES AND FABRICATION TECHNIQUES," which claims the benefit under 35 U.S.C. §119 of provisional application No. 62/075,318 filed Nov. 5, 2014, which application is hereby incorporated herein by reference.

STATEMENT REGARDING FEDERALLY SPONSORED RESEARCH

This invention was made with government support under Contract No. FA8721-05-C-0002 awarded by the U.S. Air Force. The government has certain rights in the invention.

FIELD

This disclosure relates generally to multi-layer semiconductor devices, and more particularly, to multi-layer semiconductor devices which are fabricated using a combination of substrate and via structures and fabrication techniques.

BACKGROUND

As is known in the art, there is trend toward miniaturization of electronic products such as mobile phones, tablets, digital cameras, and the like. Consequently, there has been a trend in semiconductor device manufacturing towards smaller and more densely packed semiconductor structures and sections. This has resulted in a demand for semiconductor packages which are relatively low loss, lightweight structures and which support increased electronic capabilities (e.g., increased density, mobility and extended operational life) in miniaturized electronic products demanded by both military and commercial customers alike.

The foregoing trend and demand, drives a need for multi-layer semiconductor devices, semiconductor devices including at least two semiconductor structures or sections. The foregoing trend and demand also drives a need for interconnect structures which enable assembly of multi-layer semiconductor devices which include a combination of substrate and via structures, and which are fabricated using a combination of fabrication techniques.

SUMMARY

Described herein are concepts, systems, circuits and techniques related to multi-layer semiconductor devices and interconnect structures fabricated using a combination of substrate and via structures and fabrication techniques. The described systems and techniques can be used to provide multi-layer semiconductor devices having increased circuit density in comparison to conventional semiconductor devices. The described systems and techniques can also be used to provide multi-layer semiconductor devices having a maximum number of device layers and a thinnest possible active area cross-section (e.g., a thinnest possible active area cross-section of the multi-layer semiconductor device).

The described systems and techniques can additionally be used to provide multi-layer semiconductor devices having a thinnest possible cross-section and greatest possible number of semiconductor sections fabricated using bulk semiconductor fabrication techniques. The described systems and techniques can further be used to provide for flexibility in placing semiconductor sections fabricated using bulk semiconductor fabrication techniques and/or Silicon-On-Insulator (SOI) fabrication techniques at substantially any functional section (or tier) level of the multi-layer semiconductor devices.

In one aspect of the concepts described herein, a multi-layer semiconductor device includes two or more semiconductor sections, each of the semiconductor sections having first and second opposing surfaces. Each of the semiconductor sections includes at least one insulating layer having first and second opposing surfaces. Additionally, each of the semiconductor sections includes at least one device layer having first and second opposing surfaces and a plurality of electrical connections extending between the first and second surfaces. The electrical connections correspond to first conductive structures. The multi-layer semiconductor device also includes one or more second conductive structures. Each of the second conductive structures extends through at least a portion of at least one of the semiconductor sections, and is electrically coupled to select ones of the electrical connections in the at least one of the semiconductor sections. The second conductive structures are provided as through oxide via (TOV) or through insulator via (TIV) structures.

The multi-layer semiconductor device additionally includes one or more silicon layers having first and second opposing surfaces. At least a first one of the silicon layers includes at least one third conductive structure which extends between select portions of the first and second surfaces of the first one of the silicon layers. The at least one third conductive structure is electrically coupled to at least one of the second conductive structures to form one or more electrical connections between the first one of the silicon layers and one or more of the semiconductor sections, the at least one third conductive structure provided as a through silicon via (TSV) structure.

The multi-layer semiconductor device further includes one or more via joining layers. Each of the via joining layers is disposed between and coupled to a select two of the semiconductor sections, a select two of the silicon layers, or a select one of the semiconductor sections and a select one of the silicon layers. Each of the via joining layers also has first and second opposing surfaces and includes at least one fourth conductive structure extending between select portions of the first and second surfaces of the via joining layer. The at least one fourth conductive structure is electrically coupled to the select two of the semiconductor sections, the select two of the silicon layers, or the select one of the semiconductor sections and the select one of the silicon layers to form one or more electrical connections between the select two of the semiconductor sections, the select two of the silicon layers, or the select one of the semiconductor sections and the select one of the silicon layers.

The multi-layer semiconductor device may include one or more of the following features individually or in combination with other features. The first conductive structures are provided as through oxide via (TOV) or through insulator via (TIV) structures. The at least one fourth conductive structure is provided as a through oxide via (TOV) structure or a through insulator via (TIV) structure. First select ones of the first conductive structures, first select ones of the second conductive structures, the at least one third conductive structure, and the at least one fourth conductive structure are electrically coupled to form an interconnect structure which extends through each of semiconductor sections, each of the via joining layers and the first one of the silicon layers.

The semiconductor device comprises three semiconductor sections. The first surface of a first one of the semiconductor sections is disposed over and coupled to the second surface of the first one of the silicon layers. The first surface of a second one of the semiconductor sections is disposed over and coupled to the second surface of the first one of the semiconductor sections. A first one of the via joining layers is disposed between and coupled to the second surface of the second one of the semiconductor sections and the second surface of a third one of the semiconductor sections.

The semiconductor device comprises a second conductive structure which extends from and forms an electrical connection between first select ones of the electrical connections in the first one of the sections, first select ones of the electrical connections in the second one of the sections, and the second surface of the second one of the sections. The second conductive structure is electrically coupled to the at least one fourth conductive structure in the first one of the via joining layers. The first and third ones of the semiconductor sections are each fabricated using bulk semiconductor fabrication techniques. The second one of the semiconductor sections is fabricated using at least Silicon-On-Insulator (SOI) fabrication techniques.

The first one of the semiconductor sections and the second one of the semiconductor sections are each provided as part of a first semiconductor structure. The third one of the semiconductor sections is provided as part of a second semiconductor structure. The first one of the via joining layers electrically couples the second semiconductor structure to the first semiconductor structure. The second one of the sections is electrically coupled to the first one of the sections using via-last techniques. The third one of the sections is electrically coupled to the second one of the sections using via-first techniques. The at least one device layer includes one or more circuit devices disposed between the first and second surfaces of the device layer. The circuit devices are electrically coupled to select ones of the electrical connections in the device layer. The first and second surfaces of the semiconductor sections each include or are coated with a bondable dielectric material.

A predetermined distance of between about eight micrometers (μm) and about twelve μm exists between the first and second surfaces of the first one of the silicon layers. The predetermined distance corresponds to a height of the first one of the silicon layers. A predetermined distance of between about six μm and about eight μm exists between the first and second surfaces of each of the semiconductor sections. The predetermined distance corresponds to a height of the semiconductor sections. A predetermined distance of between about one μm and about three μm exists between the first and second surface of each of the via joining layers. The predetermined distance corresponds to a height of the via joining layers.

A second one of the silicon layers includes at least one third conductive structure which extends between select portions of the first and second surfaces of the second one of the silicon layers. The semiconductor device includes four semiconductor sections. The first surface of a first one of the semiconductor sections is disposed over and coupled to the second surface of the first one of the silicon layers. The first surface of a second one of the semiconductor sections is disposed over and coupled to the second surface of the first one of the semiconductor sections. A first one of the via joining layers is disposed between and coupled to the second surface of the second one of the semiconductor sections and the first surface of the second one of the silicon layers. A second one of the via joining layers is disposed between and coupled to the first surface of the third one of the semiconductor sections and the second surface of a fourth one of the semiconductor section.

In another aspect of the concepts described herein, a method for fabricating a multi-layer semiconductor device includes providing two or more semiconductor sections. Each of the semiconductor sections has first and second opposing surfaces and includes at least one insulating layer having first and second opposing surfaces. Additionally, each of the semiconductor sections includes at least one device layer having first and second opposing surfaces and a plurality of electrical connections extending between the first and second surfaces. The electrical connections correspond to first conductive structures. The method also includes forming second conductive structures. Each of the second conductive structures extends through at least a portion of at least one of the semiconductor sections. Additionally, each of the second conductive structures is electrically coupled to select ones of the electrical connections in the at least one of the semiconductor sections. The second conductive structures are provided as through oxide via (TOV) or through insulator via (TIV) structures.

The method additionally includes providing one or more silicon layers having first and second opposing surfaces. At least a first one of the silicon layers includes at least one third conductive structure which extends between select portions of the first and second surfaces of the first one of the silicon layers. The at least one third conductive structure is also electrically coupled to at least one of the second conductive structures to form one or more electrical connections between the first one of the silicon layers and one or more of the semiconductor sections, the at least one third conductive structure provided as a through silicon via (TSV) structure.

The method further includes providing one or more via joining layers. Each of the via joining layers is disposed between and coupled to a select two of the semiconductor sections, a select two of the silicon layers, or a select one of the semiconductor sections and a select one of the silicon layers. Additionally, each of the via joining layers has first and second opposing surfaces and includes at least one fourth conductive structure extending between select portions of the first and second surfaces of the via joining layer. The at least one fourth conductive structure is electrically coupled to the select two of the semiconductor sections, the select two of the silicon layers, or the select one of the semiconductor sections and the select one of the silicon layers to form one or more electrical connections between the select two of the semiconductor sections, the select two of the silicon layers, or the select one of the semiconductor sections and the select one of the silicon layers.

The method may include one or more of the following features either individually or in combination with other features. Electrically coupling first select ones of the first conductive structures, first select ones of the second conductive structures, the at least one third conductive structure, and the at least one fourth conductive structure to form an interconnect structure which extends through each of semiconductor sections, each of the via joining layers and the first one of the silicon layers.

Providing two or more semiconductor sections includes providing two or more semiconductor sections, each of the semiconductor sections having first and second opposing surfaces and including at least one insulating layer having first and second opposing surfaces. Each of the semiconductor sections also includes at least one device layer having first and second opposing surfaces and a plurality of electrical connections extending between the first and second surfaces. The electrical connections correspond to first conductive structures. First select ones of the semiconductor sections are fabricated using bulk semiconductor fabrication techniques, and second select ones of the semiconductor sections are fabrication using at least Silicon-On-Insulator (SOI) fabrication techniques.

BRIEF DESCRIPTION OF THE DRAWINGS

Features and advantages of the concepts, systems, circuits and techniques disclosed herein will be apparent from the following description of the embodiments taken in conjunction with the accompanying drawings in which.

DETAILED DESCRIPTION

Figure 1:
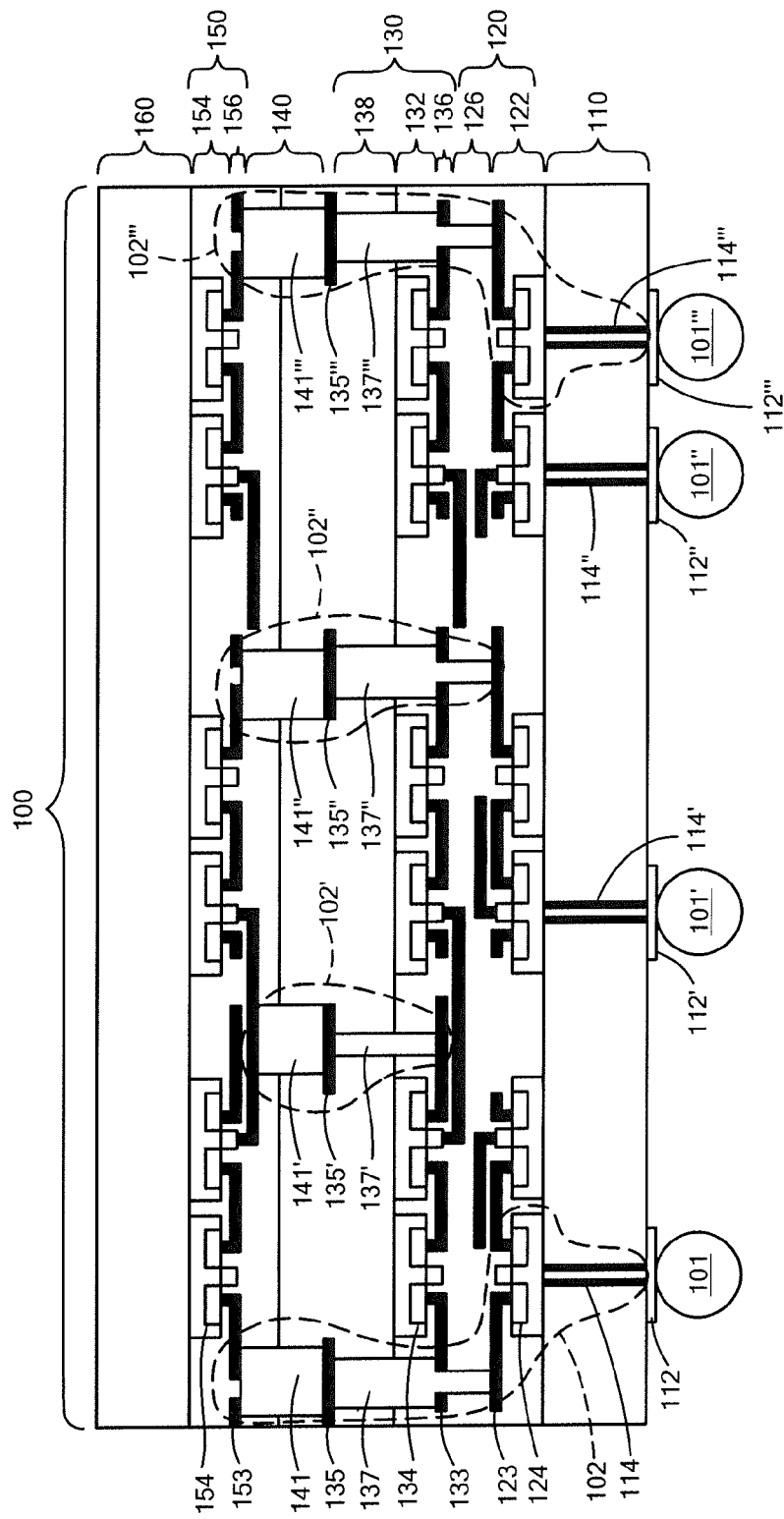
FIG. 1 is a block diagram of an example multi-layer semiconductor device including a plurality of sections, a plurality of silicon layers, and a via joining layer.

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected. Embodiments of the present disclosure and associated advantages may be best understood by referring to the drawings, where like numerals are used for like and corresponding parts throughout the various views. It should, of course, be appreciated that elements shown in the figures are not necessarily drawn to scale. For example, the dimensions of some elements may be exaggerated relative to other elements for clarity.

Definitions

For convenience, certain introductory concepts and terms used in the specification are collected here.

As used here, the term "chemically activated surface" is used to describe a surface which is minimally etched and/or damaged. The hydrophilicity or hydrophobicity of the surface may be changed with appropriate plasma and/or chemical treatment by changing or modifying surface chemistry.

As used herein, the term "circuitized substrate" is used to describe a semiconductor structure including at least one dielectric layer, the at least one dielectric layer having at least one surface on which at least one circuit is disposed. Examples of dielectric materials suitable for the at least one dielectric layer include low temperature co-fired ceramic (LTCC), ceramic (alumina), fiberglass-reinforced or non-reinforced epoxy resins (sometimes referred to simply as FR4 material, meaning its Flame Retardant rating), polytetrafluoroethylene (Teflon), polyimides, polyamides, cyanate resins, photoimagable materials, and other like materials, or combinations thereof. Examples of electrically conductive materials suitable for the at least one circuit include copper and copper alloy. If the dielectric layer is provided from a photoimagable material, it is photoimaged or photopatterned, and developed to reveal the desired circuit pattern, including the desired opening(s) as defined herein, if required. The dielectric layer may be curtain coated or screen applied, or it may be supplied as a dry film or in other sheet form.

As used herein, the term "conductive fusible metal" is used to describe a metal including one or more of tin-lead, bismuth-tin, bismuth-tin-iron, tin, indium, tin-indium, indium-gold, tin-indium-gold, tin-silver, tin-gold, indium, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof. The metals may change forms (e.g., from a solid to a liquid) during a bonding or during post bonding annealing or reflow process.

As used herein, the term "conductive structure" is used to describe an interconnect structure for electrically coupling one or more interconnect pads, electrical connections, components, devices, modules, and semiconductor structures and devices. The conductive structure may include at least one of a micro via having a diameter which is between about one micrometer (μm) and about one-hundred fifty μm's and a sub-micron via having a diameter of less than about one μm.

As used herein, the term "device layer" is used to describe a single or multilayer structure including a number of active or passive semiconductor components, the structure capable of performing at least part of the functional operations (i.e., semiconductor system performance) of a semiconductor structure. Device layers are typically fabricated separately on Silicon on insulator (SOI) substrates or bulk Silicon (Si) substrates. Additionally, each device layer may include at least one interconnect and one or more of active Si, Gallium nitride (GaN) and III-V field-effect transistors (FETs).

Example device layers may include complementary metal-oxide semiconductor (CMOS) integrated circuits having a pair of transistors, one using electrons and the other electron holes. Silicon (Si) and/or Germanium (Ge) semiconductor materials may be used to fabricate device layers having silicon transistors in high performance applications, for example. Alternative semiconductor materials such as Gallium Nitride (GaN) and Silicon Carbide (SiC) may also be used as they then to cope much better at higher temperatures (e.g., Si for electronics and compound semiconductors for photonics). Silicon dioxide ($SiO_2$) and hafnium dioxide ($HfO_2$) may be used as insulator materials or structures within transistors. Additionally, III-V compound semiconductors, particularly those containing Indium such as Indium Arsenide and Indium Antimonide combined with germanium-rich transistors (e.g., nfinFETs with fins that are 5 nm wide or less), may also be used in device layers.

Example device layers may also include quantum-well devices which are fabricated high-mobility materials such as fully depleted silicon-on-insulator (FD-SOI) materials (e.g., in quantum-well devices having a thickness between about twenty two nanometers (nm) and about twenty eight nm). Such may be suitable for low-power applications like the Internet of Things (IoT). Nanowire FETs may also be found in device layers. In the backend, low-k treatments of nanowire FETs are critical). Self-alignment is also very important.

It is possible to operate some of the circuit elements or devices (e.g., transistors) in device layers at low temperatures (e.g., a temperature which is greater than room temperature up to about 4 K) to provide for reduced operating voltages, higher speed operation and low power dissipation. It is further possible to utilize transistor technology with "low" and/or "ultra-low" power requirements and increased switching speeds in comparison to room temperature transistor devices in device layers. It is also possible to consider room temperature and/or high temperature devices as low temperature devices if these devices will operate at low temperature ranges. 2D materials (e.g., Graphene) and/or 2D material based devices (e.g., Vanadium dioxide based hybrid field effect transistors) can be used as a functional section or device layer, or be provided as part of a functional section or device layer. Various bandgap materials including Si, Ge, InSb, InAs, InP, GaP, GaAs, GaS, CdS, CdSe, CdTe, and ZnO may further used to fabricate device layers.

As used herein, the term "electronic device" is used to describe an integrated circuit (IC) device (e.g., a semiconductor chip).

As used herein, the term "interposer" is used to describe an interconnect structure capable of electrically coupling two or more semiconductor structures together.

As used herein, the term "module" is used to describe an electrical component having a substrate (e.g., a silicon substrate or printed circuit board (PCB)) on which at least one semiconductor device is disposed. The module may include a plurality of conductive leads adapted for coupling the module to electrical circuitry and/or electrical components located externally of the module. One known example of such a module is a Multi-Chip Module (MCM), such modules coming in a variety of shapes and forms. These can range from pre-packaged chips on a PCB (to mimic the package footprint of an existing chip package) to fully custom chip packages integrating many chips on a High Density Interconnection (HDI) substrate.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied, for example, in a specially programmed microprocessor, a digital signal processor (DSP), or an application specific integrated circuit (ASIC), which can be an analog ASIC or a digital ASIC. Additionally, in some embodiments the "processor" can be embodied in configurable hardware such as field programmable gate arrays (FPGAs) or programmable logic arrays (PLAs). In some embodiments, the "processor" can also be embodied in a microprocessor with associated program memory. Furthermore, in some embodiments the "processor" can be embodied in a discrete electronic circuit, which can be an analog circuit or digital circuit.

As used herein, the term "self-bondable oxide" is used to describe multilayer oxide (e.g., single or multi component, doped or undoped, high density-low density, etc.), the multilayer oxide having at least one chemically activated, ultra-smooth bonding surface (e.g., within a predetermined number of angstroms (Å)) capable of bonding with another self-bondable oxide without any external force. The process for bonding a first self-bondable oxide with a second self-bondable oxide, etc. requires minimum force to activate bonding at a symmetry point on a bonding surface of the first and second self-bondable oxides (e.g. wafers), and little to no additional force to self-propagate bonding to entire surfaces of the first and second self-bondable oxides. Self-bondable oxides preferably use an oxidizing-reducing agent to chemically activate a bonding surface.

RCA cleaning procedures (e.g., RCA-1 clean, RCA-2 clean) and/or high frequency (HF) and/or mega sonic cleaning and/or Plasma (e.g. oxygen) and/or Ammonium Hydroxide may be used for pre-bond surface treatments for the self-bondable oxide. Additionally, annealing the self-bondable oxide at a temperature between about one-hundred fifty degrees Celsius (C) and about five-hundred degrees C. in presence of Hydrogen (H) or Nitrogen (N) may increase bond strength of the self-bondable oxide.

As used herein, the term "substrate" is used to describe any structure upon which an integrated circuit or semiconductor device can be disposed or upon which semiconductor materials can be deposited and/or into which semiconductor materials can be implanted and diffused to form a semiconductor structure or device, for example. In some embodiments, the substrate may be provided as a P-type substrate (i.e., a substrate) having a particular range of concentrations of P-type atoms (i.e., ions). In other embodiments an N-type substrate may be used (i.e., a substrate having a particular range of concentration of N-type atoms).

The substrate may, for example, be provided from a semiconductor material, an insulator material or even a conductor material. For example, the substrate may be provided from silicon, alumina, glass or any other semiconductor material. Further, the substrate can include a number of metal-oxide-silicon (MOS) devices, complementary-MOS (CMOS) devices, or a number of active or passive integrated circuit semiconductor devices.

As used herein, the term "three-dimensional (3-D) integrated circuit (IC)" is used to describe a semiconductor structure including at least two device layers (e.g., which are vertically stacked) and interconnects (e.g., vertical interconnects) to make one or more electrical connections between the device layers.

As used herein, the term "through oxide via (TOV)" is used to describe a via (e.g., micro via) in a semiconductor structure used to connect adjacent device layers. The TOV passes through one or more oxide, dielectric, and/or metal layers and terminates at a predetermined Silicon (Si) layer or surface.

As used herein, the term "via first" is used to describe a micro via and/or a submicro via used to make at least one electrical connection between a first device layer and second device layer in a semiconductor structure including at least two device layers. Additionally, as described here, the term "via" first may also be used to describe a micro via and/or a submicro via passing through a dielectric material or layer (in some embodiments, only the dielectric material or layer) to make at least one electrical connection between a first device layer and a second device layer in a semiconductor structure including at least two device layers. For a via first process, the first device layer and the second device layer are completed separately. As one example, a partial via material is added on first and/or second opposing surfaces (i.e., top and/or bottom surfaces) of the first second device layers and subsequent bonding and/or post bonding process create a via first between the first and second device layers.

The via first may be filled with at least one metal or alloy having a high Coefficient of Thermal Expansion (CTE) to produce a rigid, robust, and conductive via first joint between the at least two device layers during the composite bonding process. High temperatures and/or high pressures may be applied and used to bond the two device layers and provide a three-dimensional (3D) interconnection (i.e., interconnect) among the device layers. The high CTE metal or alloy are expanded at relatively high temperatures and interdiffuse with each other to produce the 3D interconnect. Alternatively, the via first may be filled with a low temperature fusible metal which melts and interdiffuse during bonding or post bonding processes.

As used herein, the term "via last" is used to describe a micro via and/or a submicro via used to make at least one electrical connection between a first device layer and a second device layer in a semiconductor structure including at least two device layers. Fabrication of the first device layer is completed first, and the second device layer is deposited over the first device layer. The second device layer is completed with via last process. A pad layer which includes one or more interconnect pads may be added after via last process. In one embodiment, via last is filled. Additionally, in one embodiment, the via last can be unfilled or partially filled. Via last may pass through the device layers (e.g., second device layers) and, in some embodiments, one or more isolation layers or materials. A titanium (Ti) material having a thickness of about ten nanometers (nm) and, a metal organic chemical vapor deposition (MOCVD) Titanium Nitride (TiN) liner having a thickness of about five nm, and tungsten plugs may be used for via lasts. A MOCVD or chemical vapor deposition (CVD) $TiN_X$, with X less than or equal to 1, is preferred for better conformal coating.

As used herein, the term "through silicon via" (TSV) is used to describe a vertical interconnect which passes substantially through one or more of a silicon wafer, a silicon die, a silicon interposer, silicon active circuits, silicon passive circuits, or silicon passive circuits. TSVs can be fabricated by different methods and approaches. In Silicon (Si) via-first approaches, for example, TSVs are fabricated prior to fabrication of active devices (i.e. bipolar or MOSFET devices) to which the TSVs may be coupled. The approach includes patterning the TSVs, lining the TSVs with a high temperature dielectric (thermal oxide or chemical vapor deposition), filling the TSVs with doped polysilicon and using chemical mechanical polishing (CMP) techniques to remove excess polysilicon from one or more surfaces of the TSVs. Si via-first approaches allow for the use of high temperature processes to insulate and fill the TSVs.

In Si via-middle approaches, TSVs are fabricated after forming the active devices to which the TSVs may be coupled, but before back end of line (BEOL) stack fabrication. The approach includes patterning the TSVs after a contact process, lining the TSVs with a low temperature dielectric deposition, and then filling the TSVs with single/multiple barrier metals. Typically the TSVs are filled with Cu and/or W. For TSVs filled with Cu, a Cu seed layer is disposed on top of a barrier layer and a subsequent Cu electroplating fills the TSVs. The TSVs are then planarized using CMP techniques. For W, chemical vapor depositing (CVD) processes are used to fill the TSVs, and CMP techniques are used to remove excess polysilicon from one or more surfaces of the TSV. W is preferred for filling high aspect ratio TSVs (e.g., TSVs with aspect ratio of height-to-width>10:1). In general, Cu is used to fill low aspect ratio TSVs (e.g., TSVs with aspect ratio<10:1). Si via-middle process are useful for fabricating TSVs with a small via pitch, TSVs having minimal blockage of wiring channels, and TSVs having a low via resistance, for example.

In front side Si via-last approaches, TSVs are fabricated at the end of the BEOL processing of the wafer. Si via-last approaches are similar to Si via middle approaches, but Si via-last approaches use low temperature dielectric depositions (<400 C) compared to higher temperature dielectric compositions (<600 C) in Si via middle approaches. Front side Si via-last approaches are suitable for the coarse TSV feature size to simplify process integration of TSVs. The front side Si via-last approaches are also useful for wafer-to-wafer bonding. In such approaches, TSVs can be formed at the end of the process, connecting multiple layers in the 3D stack.

Front side Si via-last approaches uses TSV etch as well as the entire BEOL dielectric stack. Backside Si via-last approaches also uses wafer to wafer stacking. The wafers can be bonded together using oxide bonding or polymer adhesive bonding, either front-to-front or front-to-back. Wafer can be thinned by etching and or polishing. TSV will be formed by etching via down to bond pads on the top wafer and the bottom wafer. The process includes patterning the TSVs after the contact process, lining the TSVs with a low temperature dielectric deposition, and then filling the TSVs with single/multiple barrier metal (e.g., Cu and/or W). The TSVs are then planarized through a subsequent CMP process.

A number of inorganic and organic dielectric materials having a thickness in a range of about one hundred nm to about one thousand nm can be used to insulate the TSVs. TSV dielectrics are required to have good step coverage (at least 50% through the depth of the trench), good thickness uniformity (<3% variation across the wafer), high deposition rate (>100 nm/min), low stress (<200 MPa), low leakage current (<1 nA/cm2), and high breakdown voltage (>5 MV/cm). Plasma-enhanced chemical vapor deposition (PECVD) of SiO2 or SiN, or sub-atmospheric chemical vapor depositions (SACVD) of SiO2, are some examples of insulator deposition. The most commonly used conductors to fill TSVs are doped polysilicon (180 lohm-cm), tungsten (5.6 lohm-cm), or copper (1.7 lohm-cm). W deposited by CVD has a good fill of the TSV and can be integrated with the contacts to which the TSVs are to be coupled. A TiN liner is required to ensure that the WF6 precursor does not attack the Si substrate in the TSV. A disadvantage of W compared to Cu is that it has a high intrinsic stress (1400 MPa for W, 20 MPa for Cu). Reactive-ion-etching (RIE) is used to create high aspect ratio TSVs and deep trench structures in the Si (i.e., for capacitors or for isolation) in which the TSVs are provided. TSV RIE Bosch process alternates between deposition and etch steps, to fabricate deep vias. SF6 isotropic etching of Si is not suitable for forming TSVs (which require a highly anisotropic etch). Fluorocarbon chemistry (e.g., C4F8) is used for anisotropic etching achieved through the deposition of a chemically inert passivation on the sidewall of the TSVs.

CMP may be used for planarization of metal filled vias (e.g., micro vias), for example. Additionally, a metal contact (i.e. pad) in an upper device layer (e.g., the second device layer) may be an annulus with an about a one point five micrometer (μm) opening that also functions as a self-aligned mask (e.g., hard mask) during the plasma etch of the oxide beneath it to reach a corresponding metal contact in a lower device layer (e.g., the first device layer). In order to fully dispose and electrically the vias (e.g., TSVs), the size of the metal contacts, and thus the pitch of the vertical interconnect, is made proportional to about twice the wafer-wafer misalignment of the wafers including the first and second device layers.

As used herein, the term "bulk Complementary metal-oxide semiconductor (CMOS)) fabrication techniques" is used to describe semiconductor fabrication techniques in which CMOS circuit elements or devices are fabricated in a Silicon (Si) substrate.

As used herein, the term "Silicon-On-Insulator (SOI) CMOS fabrication techniques" is used to describe semiconductor fabrication techniques in which CMOS circuit elements or devices are isolated from a Si substrate by one or more dielectric materials. SOI CMOS fabrication techniques may be used to significantly reduce junction capacitances and allow the CMOS circuit elements or devices to operate at a "higher" speed or at a substantially "lower" power level at a same speed as those which are fabricated through bulk CMOS fabrication techniques, for example. SOI CMOS fabrication techniques also reduces or eliminates latch up effects that may be found in bulk CMOS, and improves the short channel effect and soft error immunity.

While multi-layer semiconductor devices including a select number of semiconductor sections (e.g., one, two or three sections) are described in several examples below, the select number of sections (e.g., functional sections or tiers) are discussed to promote simplicity, clarity and understanding in the drawings as well as in the written description of the broad concepts, systems, circuits and techniques sought to be protected herein and is not intended to be, and should not be construed, as limiting. The concepts, systems, circuits and techniques disclosed herein may, of course, be implemented using more than or less than the select number of sections.

Additionally, while multi-layer semiconductor devices including semiconductor sections which are the same as or similar to each other are described in several examples below, such are discussed to promote simplicity, clarity and understanding in the drawings as well as in the written description of the broad concepts, systems, circuits and techniques sought to be protected herein and is not intended to be, and should not be construed, as limiting. The concepts, systems, circuits and techniques disclosed herein may, of course, be implemented using semiconductor sections which are different from each other.

Referring now to FIG. 1, an example multi-layer semiconductor device 100 (e.g., a three-dimensional (3-D) integrated circuit (IC) structure), and corresponding interconnect structures, as may be fabricated using a combination of substrate and via structures and fabrication techniques are shown. The semiconductor device 100 has first and second opposing surfaces and includes a plurality of sections (here, three sections). Each of the sections (e.g., functional sections or tiers) includes a plurality of layers (e.g., insulating and device layers, as will be discussed).

A first one of the sections (e.g., a tier-1 functional section) 120 of semiconductor device 100, which is also sometimes referred to herein as a "first section" 120, has first and second opposing surfaces. The first section 120 is fabricated using bulk semiconductor (e.g., bulk Complementary metal-oxide semiconductor (CMOS)) fabrication techniques and includes a device (or "functional") layer 122 and an insulating layer 126, each of which also has first and second opposing surfaces. The first surface of the device layer 122 corresponds to the first surface of the first section 120, and the second surface of the insulating layer 126 corresponds to the second surface of the first section 120 in the illustrated embodiment. The first surface of the device layer 122 and the second surface of the insulating layer 124 each include or are coated with a bondable dielectric material (e.g., Silicon oxide ($SiO_x$)).

The device layer 122 has a plurality of electrical connections (e.g., vias or conductive paths) extending between the first and second surfaces of the device layer 122. The electrical connections (e.g., 123), which are provided as so-called "first" via structures in the illustrated embodiment, as will be discussed, may, for example, be made by drilling holes through the device layer 122 in appropriate locations and plating and/or sputtering and/or vaporizing the inside of the holes with one or more electrically conductive materials (e.g., Copper (Cu), Nickel (Ni), Titanium (Ti), Titanium nitride (TiN) and Tungsten (W)). The electrical connections may include a combination of materials having so-called "high" and "low" coefficients of thermal expansion (CTE) (e.g., .g., Cu has a "high" CTE of about 16.5 parts per million per degree Celsius, and W has a "low" CTE of about 4.6 parts per million per degree Celsius). Example combinations include Ni/Ti, Ti/TiN/W, Ti/Cu, and Ti/Ni/Cu.

The device layer 122 also includes a plurality of circuit devices (e.g., 124) disposed between the first and second surfaces of the device layer 122. The circuit devices, each of which may be passive or active, for example, are electrically coupled to select ones of the electrical connections (e.g., 123) in the device layer 122. The circuit devices (e.g., transistors) may also be electrically coupled to each other and to one or more other circuit components, devices, and modules (e.g., resistors, inductors, integrated circuits) (not shown) in the device layer 122. Additionally, the circuit devices may be electrically coupled to select electrical connections and select circuit components, device, and modules in one or more other sections (e.g., second and third sections) of the semiconductor device 100 (e.g., through one or more conductive structures, as will be discussed).

The insulating layer 126, which may be provided from one or more electrically insulating materials (e.g., bondable oxide, re-workable oxide, seamless oxide, etch-stoppable oxide, thermal oxide), for example, is disposed (or deposited) over and coupled to the second surface of the device layer 122. The insulating layer 126 electrically insulates the device layer 122 from other device layers of semiconductor device 100 (e.g., device layer 132, as will be discussed). In one embodiment, insulating layer 126 has a thickness (i.e., a distance between the first and second opposing surfaces) of less than about a micron. In one embodiment, the thickness is between about five-hundred nanometers (nm) and about nine-hundred nm.

A second one of the sections (i.e., a tier-2 functional section) 130 of semiconductor device 100, which is also sometimes referred to herein as a "second section" 130, has first and second opposing surfaces and is fabricated using at least Silicon-On-Insulator (SOI) (e.g., SOI Complementary metal-oxide semiconductor (CMOS)) fabrication techniques in the illustrated embodiment (e.g., to provide for a semiconductor device which includes functional sections fabricated using a combination of fabrication techniques, technologies and/or materials). The first surface of the second section 130, which includes or is coated with a bondable dielectric material (e.g., a self-bondable oxide material) having a same or similar surface roughness as the bondable dielectric material of the first section 120 (i.e., a common dielectric material), is disposed over and coupled to the second surface of the first section 120 (e.g., using oxide bonding techniques where each bonding surface requires a self-bondable oxide material). Additionally, the second section 130 is electrically coupled to the first section 120 using conductive structures (e.g., conductive structures 137, 137', 137", and 137'", as will be discussed).

The second section 130 includes a device layer 132 which may be the same as or similar to device layer 122 of first section 120. The second section 130 also includes a first insulating layer 136 and a second insulating layer 138, each of which may be the same as or similar to insulating layer 126 of first section 120. A first surface of the first insulating layer 136 corresponds to the first surface of the second section 130, and a second surface of the second insulating layer 138 corresponds to the second surface of the second section 130 in the illustrated embodiment. The device layer 132 is disposed between a second surface of the first insulating layer 136 and a first surface of the second insulating layer 138. Similar to device layer 122 of first section 120, device layer 132 of second section 130 has a plurality of electrical connections (e.g., 133), or "first" via structures, extending between first and second surfaces of the device layer 132. Device layer 132 also includes a plurality of circuit devices (e.g., 134) disposed between the first and second surfaces of the device layer 132.

The second section 130 additionally includes a plurality of interconnect pads (here, interconnect pads 135, 135', 135", and 135'"). Interconnect pads 135, 135', 135", and 135'" each have first and second opposing surfaces and a plurality of sides. Additionally, interconnect pads 135, 135', 135", and 135'" are each provided in a pattern or shape which promotes scalability of the semiconductor device 100 (e.g., for electrically coupling third section 150 to second section 130, as will be discussed). A first surface of interconnect pads 135, 135', 135", and 135'" is disposed over or beneath (e.g., attached or otherwise coupled to) select portions of the second surface of the second section 130 using techniques well known to those of ordinary skill in the art.

A plurality of conductive structures (here, conductive structures 137, 137', 137" and 137'") fabricated using via-last techniques are formed in select portions of each of the second section 130 and the first section 120. The conductive structures 137, 137', 137" and 137'", which are provided as so-called "second" via structures in the illustrated embodiment, as will be discussed, form one or more electrical connections between the second section 130 and the first section 120 (e.g., using post bond annealing techniques). Additionally, the conductive structures 137, 137', 137" and 137'" (e.g., through oxide via (TOV) or through insulator via (TIV) structures) are electrically coupled to first surfaces of corresponding interconnect pads 135, 135', 135" and 135'". The electrical coupling may, for example, occur through bond wires or via contacts spaced between the first surfaces of the interconnect pads 135, 135', 135" and 135'" and the conductive structures 137, 137', 137" and 137' in a region below the interconnect pads 135, 135', 135" and 135'". Similar to the electrical connections (i.e., the "first" via structures) in each of the first section 120 and the second section 130, conductive structures 137, 137', 137" and 137'" (i.e., the "second" via structures) may be provided from one or more electrically conductive materials (e.g., Copper (Cu), Nickel (Ni), Titanium (Ti) and Tungsten (W)).

Conductive structure 137 extends from and forms an electrical connection between the first surface of interconnect pad 135, first select ones of the electrical connections in the second section 130, and first select ones of the electrical connections in the first section 120. Additionally, conductive structure 137' extends from and forms an electrical connection between the first surface of interconnect pad 135' and second select ones of the electrical connections in the second section 130. Additionally, conductive structure 137" extends from and forms an electrical connection between the first surface of interconnect pad 135", third select ones of the electrical connections in the second section 130, and third select ones of the electrical connections in the first section 120. Further, conductive structure 137'" extends from and forms an electrical connection between the first surface of interconnect pad 135'", fourth select ones of the electrical connections in the second section 130, and fourth select ones of the electrical connections in the first section 120.

A third one of the sections (i.e., a tier-3 functional section) 150 of semiconductor device 100, which is also sometimes referred to herein as a "third section" 150 and is similar to first section 120 in the illustrated embodiment (e.g., being fabricated using bulk semiconductor fabrication techniques (e.g., to provide for a semiconductor device which includes functional sections fabricated using a combination of fabrication techniques, technologies and/or materials), has first and second opposing surfaces. The first surface of the third section 150 is disposed over and coupled to the second surface of the second section 130 using a via joining layer (e.g., via joining layer 140, as will be discussed).

The third section 150 includes a device layer 152 which may be the same as or similar to device layer 122 of first section 120. The third section 150 also includes an insulating layer 156 which may be the same as or similar to insulating layer 126 of first section 120. A first surface of the insulating layer 156 corresponds to the first surface of the third section 150, and a second surface of the device layer 152 corresponds to the second surface of the third section 150 in the illustrated embodiment. A second surface of the insulating layer 156 is disposed over a first surface of the device layer 152. Similar to device layer 122 of first section 120, device layer 152 of third section 150 has a plurality of electrical connections (e.g., 153), or "first" via structures, extending between first and second surfaces of the device layer 152. Device layer 152 also includes a plurality of circuit devices (e.g., 154) disposed between the first and second surfaces of the device layer 152.

A via joining layer 140 (e.g., an interface layer) fabricated using via-first, via-last or a combination of via-first and via-last techniques, for example, is disposed between and coupled (e.g., using wafer-to-wafer bonding techniques) to second surfaces of each of the second section 130 and the third section 150. The via joining layer 140 has first and second opposing surfaces and includes a plurality of via joining layer conductive structures (here, conductive structures 141, 141', 141", and 141'") which electrically couple the third section 150 to the second section 130.

The via joining layer 140 converts one or more via-last structures and/or TSV structures of a preceding or subsequent section to one or more corresponding via-first structures (e.g., through conductive structures 141, 141', 141", 141'"). Each of the conductive structures 141, 141', 141", and 141'", which are provided as so-called "third" via structures in the illustrated embodiment, as will be discussed, has first and second opposing surfaces and extends between select portions of the first and second surfaces of the via joining layer 140. Conductive structures 141, 141', 141", 141'" are fabricated using via-first techniques, which requires the conductive structures 141, 141', 141", 141'" to be fabricated prior to the electrical coupling of the third section 150 to the second section 130, for example.

Additionally, each of the conductive structures 141, 141', 141", and 141'" is provided from one or more electrically conductive materials having a high CTE (e.g., Cu, Ni) in the illustrated embodiment. Further, in one embodiment, each of the conductive structures 141, 141', 141", 141'" are fabricated in two or more portions. As one example, a first portion of each of the conductive structures 141, 141', 141", 141'" may be fabricated in the second section 130, and a second portion of each of the conductive structures 141, 141', 141", 141'" may be fabricated in the third section 150. The first and second portions may be coupled to each other through one or more bonding or annealing processes.

Conductive structure 141 extends from and forms an electrical connection between the second surface of interconnect pad 135 of second section 130, and first select ones of the electrical connections in third section 150. Additionally, conductive structure 141' extends from and forms an electrical connection between the second surface of interconnect pad 135' of second section 130, and second select ones of the electrical connections in the third section 150. Additionally, conductive structure 141" extends from and forms an electrical connection between the second surface of interconnect pad 135" of second section 130, and third select ones of the electrical connections in the third section 150. Further, conductive structure 141" extends from and forms an electrical connection between the second surface of interconnect pad 135'" of second section 130, and fourth select ones of the electrical connections in the third section 150.

Additional aspects of via joining layers (e.g., 140) are described in co-pending International Application No. PCT/US2015/044608 entitled "Interconnect Structures For Assembly of Multi-layer Semiconductor Devices," which is assigned to the assignee of the present disclosure and incorporated herein by reference in its entirety.

Semiconductor device 100 also includes a plurality of silicon layers (here, two silicon layers) in the illustrated embodiment, each having first and second opposing surfaces. A first one of the silicon layers, which is also sometimes referred to herein as a "first silicon layer" 110, has a surface (e.g., a second surface) which is disposed beneath the first surface of first section 120 of semiconductor device 100. Additionally, the first silicon layer 110 includes a plurality of interconnect pads (here, interconnect pads 112, 112', 112", and 112'") which may be the same as or similar to interconnect pads 135, 135', 135", and 135'" of the second section 130. A first surface of interconnect pads 112, 112', 112", and 112'" is disposed over or beneath select portions of the first surface of the first silicon layer 110.

In one embodiment, interconnect pads 112, 112', 112", and 112'" are provided having a same material composition as interconnect pads 135, 135', 135", and 135'" for wire bonding purposes. Additionally, in one embodiment, interconnect pads 112, 112', 112", and 112'" having a thickness (i.e., a distance between the first and second surfaces) which is greater than a thickness of interconnect pads 135, 135', 135", and 135'" (e.g., interconnect pad 135 may have a thickness of about 200 nm, and interconnect pad 112 may have a thickness of about 500 nm). Further, in one embodiment, one or more under bump metals are deposited on top of one or more of interconnect pads 112, 112', 112", and 112'". Example under bump metals and combinations of under bump metals include Titanium (Ti), Chromium(Cr)/Platinum(PO/Gold(Au), and Ti/Nickel(Ni)/Au, Ti/Pt/Au. In the combination of Ti/Pt/Au, for example, the Ti may have a thickness about twenty nm, the Pt may have a thickness of about fifty nm, and the Au may have a thickness of about one hundred nm.

The first silicon layer 110 also includes a plurality of through silicon via (TSV) structures (here, TSV structures 114, 114', 114", and 114'") which extend between select portions of the first and second surfaces of the first silicon layer 110. The TSV structures 114, 114', 114", and 114'", which are provided as so-called "fourth" via structures in the illustrated embodiment, as will be discussed, provide a corresponding plurality of electrical connections between the first and second surfaces of the first silicon layer 110. TSV structure 114 extends from and forms an electrical connection between the first surface of interconnect pad 112 of first silicon layer 110, and the first select ones of the electrical connections in first section 120. Additionally, TSV structure 114' extends from and forms an electrical connection between the first surface of interconnect pad 112' of first silicon layer 110, and fifth select ones of the electrical connections in first section 120. Additionally, TSV structure 114" extends from and forms an electrical connection between the first surface of interconnect pad 112" of first silicon layer 110, and sixth select ones of the electrical connections in first section 120. Further, TSV structure 114'" extends from and forms an electrical connection between the first surface of interconnect pad 112'" of first silicon layer 110, and the fourth select ones of the electrical connections in first section 120.

In the illustrated embodiment, TSV structures 114, 114', 114", and 114'" are each filled with multiple metal and/or alloy layers. At least one of the multiple metal and/or alloy layers has low temperature melt composition and or conductive fusible metal which melts and flows to eliminate any possible electrical open within the TSV structures. The low temperature melt metal and/or alloy layer react with at least another metal within the TSV structures to create a high melt composition. It is possible to create a high melt composition with a melt temperature which can be higher than operational and/or processing temperatures. It is further possible that the low temperature melt composition melts and reacts with at least another metal composition within the TSV structures to create a high melt composition having a higher CTE than individual metal compositions.

It is further possible to use multiple metal or alloy layers having a low temperature melt composition within the TSV structures which melts and reacts with at least another metal and/or alloy within the TSV structures to create multiple high melt composition. It is further possible to create a melt gradient. It is also possible to use a multiple metal or alloy layer having a low temperature melt composition within the TSV structures which melts and reacts with at least another metal/and or alloy within the TSV structures to create multiple high melt composition and residual low melt metal which helps to heal any defects in the TSV structures which arise during operation and/or processing.

Low Nitrogen percentages in a Ta/TaN barrier layer and/or high bias power conditions during PVD seed layer depositions in the TSV structures may help to grow more Cu seed with more Cu (111) than Cu (200) orientation. Cu (111) favored Cu electroplating to fill the TSV structures. Alternate seed layers for filling the TSV structures include CVD-Cu, CVD-W, sputtered TiW/Cu, CVD-tungsten (W) and sputtered TiW/Cu. It is also possible to use single and multiple Cu seed layers, plated Cu and low melt metals and/or alloy layers within the TSV structures where low melt metals and/or alloys will melt flow to the TSV structures and repair opens (if any) within the TSV structures. Low melt metals and/or alloys (e.g. Sn) react with Cu to create at least one high melt solid solution. It is further possible that at least part of the remaining metals in the TSV structures are unreacted and can act as healing agent. It is further possible that at least part of the Cu plated layer can be replace by another metal such as Ag, Au, and/or Ni.

It is also possible to use single and or multiple low temperature melt layers which melt and form a multiple high melt composition. It is further possible to use low temperature melt metals and/or alloys (e.g., tin and Indium) which react with each other and create a lower melt (e.g., 48 weight % tin and 52 weight % tin indium) composition. It is further possible that a lower melt composition exposed to further heat-treatment will react with each other as well as other metal present in the TSV structures to create a higher melt composition than that of individual metals (e.g., tin and indium). It is further possible to create a composition gradient as well as melt temperature gradient. It is further possible to create multi metal layer TSV structures with at least one low temperature melt composition which melt and flow to repair any defects which may be present in the TSV structures.

Additionally, in some embodiments, one or more of the TSV structures can be filled with a nanoparticle conductive paste. The TSV structures can be filled with a nanoparticle conductive paste through a process in which the TSV structures are filled with the paste at around 60 C under vacuum. At around 60 C the paste will have a lower viscosity than at room temperature. Low viscosity paste under vacuum will fill the TSV structures by capillary action. This process can be used multiple times to do complete the fill. After the fill, the paste will be cured and through a subsequent CMP process the cured paste will be removed from one or more surfaces of the TSV structures. It is also possible to do CMP before final curing and to final cure the paste after the CMP. This process also favors to add a thin insulating layer around a wall of the TSV structures which will insulate/passivate a side wall of the TSV structures and provide z-direction electrical connection after curing.

Further, in some embodiments, one or more of the TSV structures can be filled with a metal based nanoparticle which has a particle size less or equal to one micron, preferably less or equal to between about two hundred nm and about five hundred nm. The metal based nanoparticle can be a pure metal particle (e.g., Au, Ag, Cu), a low temperature melt metal and or alloy (e.g., In), a low temperature melt metal and/or alloy coated metal or a combination thereof. It is possible to have single and multiple metal seed based TSV structure filled with a conductive paste. Conductive paste filling may, for example, improve electrical conductivity of the TSV structures. It is further possible to use nanoparticle slurry instead of paste to fill the TSV structures.

A second one of the silicon layers, which is also sometimes referred to herein as a "second silicon layer" 160, has a surface (e.g., a first surface) which is disposed over the first surface of third section 150 of semiconductor device 100. In the illustrated embodiment, the second silicon layer 160 is provided as a "handle" or support structure (e.g., a handle substrate) and may be provided from Silicon (Si) or Silicon carbide (SiC) as a few examples. The second silicon layer 160 may, for example, be used for coupling the semiconductor device 100 to machinery for aligning and coupling additional sections (e.g., fourth, fifth, and sixth sections, etc.) onto the semiconductor device 100. The second silicon layer 160 may also be used for aligning and coupling semiconductor device 100 onto one or more other semiconductor structures or devices. In some embodiments, the second silicon layer 160 is optional.

The second silicon layer 160 can also be "thin" (e.g., having a thickness of between about ten micron and about twenty micron) and optically transparent (e.g., as may be suitable for optical and photonics devices). A thin second silicon layer 160 may not only help to protect the third section 150 but also allow for the third section 150 to optically interact with one or more optical sources. Additionally, in some embodiments the second silicon layer 160 is provided separate from the semiconductor device 100. Further, in some embodiments the second silicon layer 160 may include one or more TSV structures which are similar to TSV structures 114, 114', 114", and 114'" of first silicon layer 110.

Semiconductor device 100 further includes a plurality of fusible coupling structures (here, fusible coupling structures 101, 101', 101", and 101'") which are disposed beneath and electrically coupled to second surfaces of interconnect pads 112, 112', 112", and 112'" of first silicon layer 110, respectively. The fusible coupling structures (e.g., ball grid array (BGA) coupling structures) may, for example, be used for coupling semiconductor device 100 to one or more other semiconductor devices and structures.

In the illustrated embodiment, a plurality of interconnect structures (here, interconnect structures 102, 102', 102" and 102'"), each including two or more via structures, are formed in semiconductor device 100. A first interconnect structure (i.e., a first interconnect) 102 is formed between TSV structure 114 (i.e., a fourth via structure), first select ones of the electrical connections in the first section 120 (i.e., first via structures), conductive structure 137 (i.e., a second via structure), first select ones of the electrical connections in the second section 130 (i.e., first via structures), conductive structure 141 (i.e., a third via structure), and first select ones of the electrical connections in the third section 150 (i.e., first via structures).

The first interconnect structure 102 may, for example, provide for an increase in a number of functional sections in the semiconductor device 100 while still maintaining a thinnest possible active area cross section in the semiconductor device. The first interconnect 102 may also help to maintain a small diameter interconnect because it uses multi-step processing to create final structure. The first interconnect structure may be used as a thermal and electrical path. For example, the addition of via last outside keeps out zone where stress field is produced but does not add additional strain in the transistors and/or devices which may be useful for removing heat from active circuits. Further, the addition of via last within close proximity of potential hotspots in the semiconductor device 100 will allow for taking heat out of a functional section to provide for more stable operation of the semiconductor device 100.

A second interconnect structure 102' is formed between second select ones of the electrical connections in the second section 130 (i.e., first via structures), conductive structure 137' (i.e., a second via structure), conductive structure 141' (i.e., a third via structure), and second select ones of the electrical connections in the third section 150 (i.e., first via structures).

Additionally, a third interconnect structure 102" is formed between third select ones of the electrical connections in the first section 120 (i.e., first via structures), conductive structure 137" (i.e., a second via structure), third select ones of the electrical connections in the second section 130 (i.e., first via structures), conductive structure 141" (i.e., a third via structure), and third select ones of the electrical connections in the third section 150 (i.e., first via structures).

Further, a fourth interconnect structure 102'" is formed between TSV structure 114'" (i.e., a fourth via structure), fourth select ones of the electrical connections in the first section 120 (i.e., first via structures), conductive structure 137'" (i.e., a second via structure), fourth select ones of the electrical connections in the second section 130 (i.e., first via structures), conductive structure 141''' (i.e., a third via structure), and fourth select ones of the electrical connections in the third section 150 (i.e., first via structures).

In one embodiment, the first via structures (e.g., TOV or TIV via structures) each have a diameter of about one hundred forty nanometers (nm). Via first and Via last structures can have a diameter between about one micron and about four microns, and TSV structures can have a diameter between about five micron and about fifty microns (e.g., with the diameters of the TSV structures depending on Si thickness of the silicon layer in which the TSV structures are present). Additionally, in one embodiment, the second via structures (e.g., TOV or TIV via structures) each have a diameter and pitch which is greater than or equal to diameter and pitch of the first via structures.

Further, in one embodiment, one or more of the second via structures has a diameter which is tunable based on space availability in the corresponding section (e.g., first section 120 and/or second section 130). For example, a first one of the second via structures (e.g., 137) may have a first diameter (e.g., a one μm diameter), and a second opposing portion of the first one of the second via structures may have a second, different diameter (e.g., a two μm diameter). Additionally, in one embodiment, the third via structures (e.g., TOV or TIV via structures) each have a diameter and pitch which is greater than or equal to diameter and pitch of the second via structures (e.g., 137).

In one embodiment, the conductive structures fabricated using via last techniques keep out zones where stress fields are produced while not adding additional strain in the transistors and or devices of the semiconductor device 100. Such may, for example, be useful for removing heat from active circuits in the semiconductor device 100. Additionally, in one embodiment, the conductive structures fabricated using via first techniques is formed within a dielectric layer without active circuits. As such, these conductive structures may be distributed throughout the entire semiconductor device 100.

In accordance with the concepts, systems, circuits, and techniques sought to be protected herein, by fabricating the semiconductor device 100 using a combination of substrate and via structures (e.g., TOV, TIV, and TSV structures) and fabrication techniques (e.g., via-first, via-last, bulk semiconductor, and SOI fabrication techniques), the semiconductor device 100 is provided having a thinnest possible active area cross-section.

A semiconductor device 100 having a thinnest possible active area cross section includes multiple functional sections (e.g., 120, 130, 150) attached with each other using through oxide and/or through silicon via bonding where each functional section can have single or multiple metal layers connected with each other by at least one sub-micron via. Each functional section (except bottom and/or top functional sections) consists of at least two different vias confined within dialectic layers. First sub-micron vias (e.g., having a diameter between about one hundred nm and about five hundred nm) are used to interconnect between layers of each functional section. Second micro vias (e.g., having a diameter between about one micron and about four micron) are used to interconnect between two functional sections. The second micro vias may consist of deep and shallow via having a larger size and pitch than the first micro via. The second micro via can also have a variable/tunable via diameter from top to bottom depending on space availability (e.g., a one um diameter at the base and two um diameter at the top).

Each via may be fully or partially filled with a low CTE metal, a high CTE metal, or both high and low CTE metals. Each functional section may have at least one common dielectric (e.g., Silicon oxide). Additionally, each functional section except the first section may be covered with at least one insulating layer and a second micro via may be formed through the insulation layer. The first functional section may have a top insulation layer for the second micro via. Material stack-ups for each functional section can be same or different from each other. Additionally, each functional section can be at least a part of individual or multiple devices.

In one embodiment, one or more of the functional sections can have an active transistor layer and two local interconnect routing layers for each active transistor layer. Bonding of the functional sections allows for the mixing of III-V transistors with Silicon CMOS transistors, for example (e.g., Si+GaN for RF circuits, Si+III-V finFETs for high performance digital circuits, Si+III-V TFETs for low power digital circuits). Each functional section may have a bondable dielectric material disposed over the first and second surfaces of the functional section, each preferably have a same or similar thickness and roughness with each other. The thickness of each functional section can be similar or different. Example thickness of the functional sections can be between about size urn and about ten um.

Additional aspects of the concepts, systems, circuits and techniques sought to be protected herein, with particular emphasis on the interconnect structures (e.g., 102) formed by using a combination of substrate and via structures and fabrication techniques, are described in conjunction with the figures below.

Figure 1A:
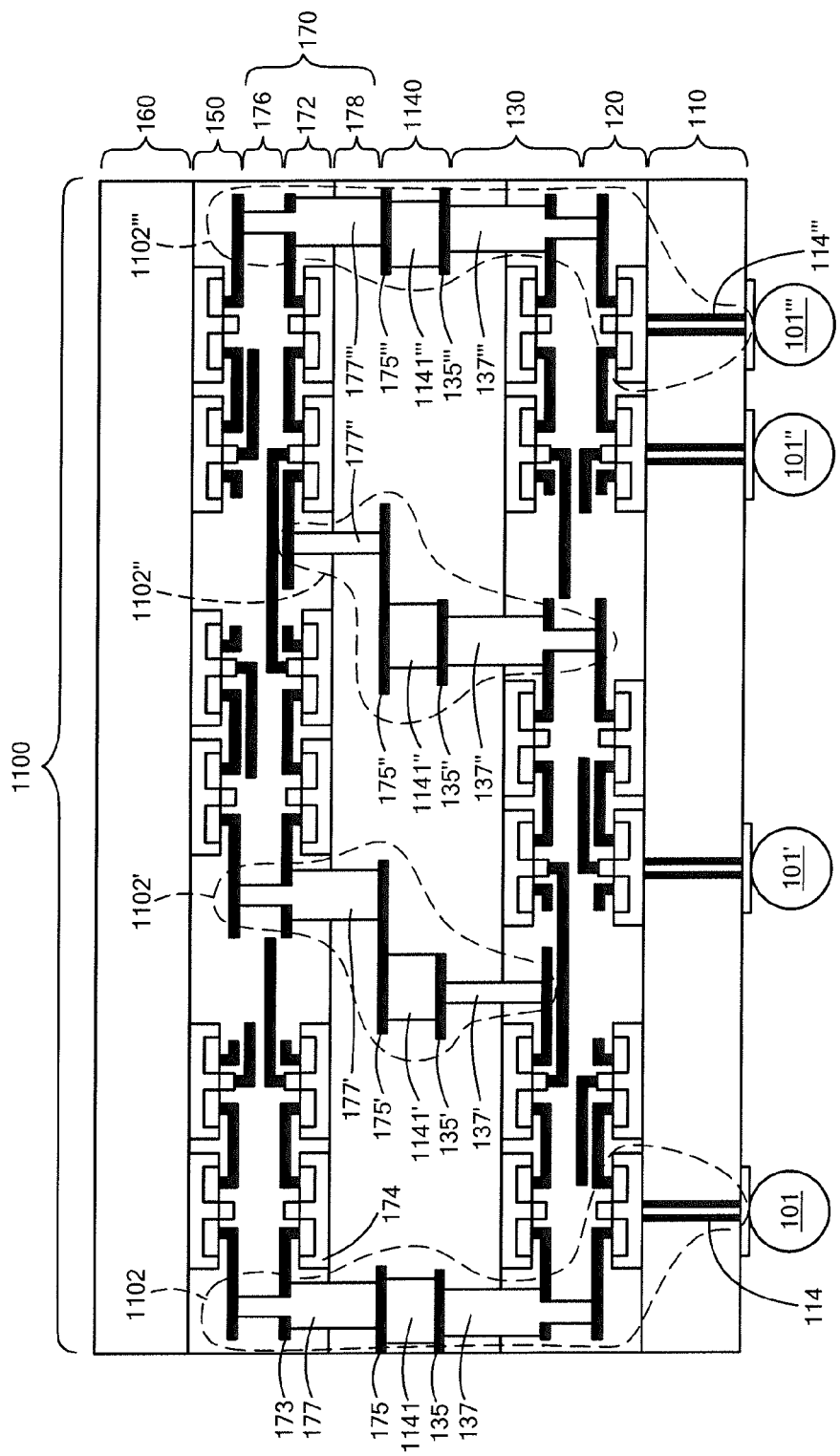
FIG. 1A is a block diagram of another example multi-layer semiconductor device including a plurality of sections, a plurality of silicon layers, and a via joining layer.

Referring now to FIG. 1A, in which like elements of FIG. 1 are provided having like reference designations, an example multi-layer semiconductor device 1100 includes fusible coupling structures 101, 101', 101'', and 101''' and first silicon layer 110. Semiconductor device 1100 also includes first section 120, second section 130, section 150 (here, fourth section 150) and second silicon layer 160.

In the illustrated embodiment, semiconductor device 1100 additionally includes a third section 170 and a via joining layer 1140. The third section 170 (i.e., a tier-3 functional section) has first and second opposing surfaces and is fabricated using SOI fabrication techniques (e.g., similar to second section 130) (e.g., to provide for a semiconductor device which includes functional sections fabricated using a combination of fabrication techniques, technologies and/or materials). The first surface of the third section 170 is disposed over and coupled to the second surface of the fourth section 150. Additionally, the second surface of the third section 170 is disposed over and coupled to the second surface of the second section 130 (e.g., using via joining layer 1140, as will be discussed).

The third section 170 includes a device layer 172 which may be the same as or similar to device layer 132 of second section 130. The third section 170 also includes a first insulating layer 176 which may be the same as or similar to first insulating layer 136 of second section 130. The third section 170 additionally includes a second insulating layer 178. A first surface of the first insulating layer 176 corresponds to the first surface of the third section 170, and a second surface of the second insulating layer 178 corresponds to the second surface of the third section 170 in the illustrated embodiment. The device layer 172 is disposed between a second surface of the first insulating layer 176 and a first surface of the second insulating layer 178. Similar to device layer 132 of second section 130, device layer 172 of third section 170 has a plurality of electrical connections (e.g., 173), or "first" via structures, extending between first and second surfaces of the device layer 172. Device layer 172 also includes a plurality of circuit devices (e.g., 174) disposed between the first and second surfaces of the device layer 172.

The third section 170 further includes a plurality of interconnect pads (here, interconnect pads 175, 175', 175", and 175'''). A first surface of interconnect pads 175, 175', 175", and 175''' is disposed over or beneath select portions of the second surface of the third section 170.

A plurality of conductive structures (here, conductive structures 177, 177', 177" and 177''') fabricated using via-last techniques, for example, are formed in select portions of each of the third section 170 and the fourth section 150. The conductive structures 177, 177', 177" and 177''', or "second" via structures, form one or more electrical connections between the third section 170 and the fourth section 150. Additionally, the conductive structures 177, 177', 177" and 177''' (e.g., through oxide via (TOV) or through insulator via (TIV) structures) are electrically coupled to first surfaces of corresponding interconnect pads 175, 175', 175" and 175'''.

In one embodiment, each of the conductive structures 177, 177', 177" and 177''' are fabricated in two or more portions. As one example, a first portion of each of the conductive structures 177, 177', 177" and 177''' may be fabricated in the third section 170, and a second portion of each of the conductive structures 177, 177', 177" and 177''' may be fabricated in the fourth section 150. The first and second portions may be coupled to each other through one or more bonding or annealing processes.

Conductive structure 177 extends from and forms an electrical connection between the first surface of interconnect pad 175, first select ones of the electrical connections in the third section 170, and first select ones of the electrical connections in the fourth section 150. Additionally, conductive structure 177' extends from and forms an electrical connection between the first surface of interconnect pad 175', second select ones of the electrical connections in the third section 170, and second select ones of the electrical connections in the fourth section 150. Additionally, conductive structure 177" extends from and forms an electrical connection between the first surface of interconnect pad 175", and third select ones of the electrical connections in the third section 170. Further, conductive structure 177''' extends from and forms an electrical connection between the first surface of interconnect pad 175''', fourth select ones of the electrical connections in the third section 170, and fourth select ones of the electrical connections in the fourth section 150.

Via joining layer 1140, which has first and second opposing surfaces, is disposed between and coupled to second surfaces of each of the second section 130 and the third section 170. The via joining layer 1140 includes a plurality of via joining layer conductive structures (here, conductive structures 1141, 1141', 1141", and 1141'''), or "third" via structures, for electrically coupling the third section 170 to the second section 130. The via joining layer 1140 may include one or more portions. As one example, the via joining layer 1140 may include first and second portions fabricated using via-last techniques. The first and second portions may each be coupled and converted to a partial via first structure before bonding.

Conductive structure 1141 extends from and forms an electrical connection between the second surface of interconnect pad 135 of second section 130, and the second surface of interconnect pad 175 of third section 170. Additionally, conductive structure 1141' extends from and forms an electrical connection between the second surface of interconnect pad 135' of second section 130, and the second surface of interconnect pad 175' of third section 170. Additionally, conductive structure 1141" extends from and forms an electrical connection between the second surface of interconnect pad 135" of second section 130, and the second surface of interconnect pad 175" of third section 170. Further, conductive structure 1141''' extends from and forms an electrical connection between the second surface of interconnect pad 135''' of second section 130, and the second surface of interconnect pad 175''' of third section 170.

Similar to semiconductor device 100 of FIG. 1, a plurality of interconnect structures (here, interconnect structures 1102, 1102', 1102" and 1102'''), each including two or more via structures, are formed in semiconductor device 1100. A first interconnect structure (i.e., a first interconnect) 1102 is formed between TSV structure 114 (i.e., a fourth via structure), first select ones of the electrical connections in the first section 120 (i.e., first via structures), conductive structure 137 (i.e., a second via structure), first select ones of the electrical connections in the second section 130 (i.e., first via structures), conductive structure 1141 (i.e., a third via structure), first select ones of the electrical connections in the third section 170 (i.e., first via structures), conductive structure 177 (i.e., a second via structure), and first select ones of the electrical connections in the fourth section 150 (i.e., first via structures). First interconnect structure 1102 may, for example, provide for the coupling of multiple functional sections with high density interconnects. The interconnects may be produced in multiple steps to complete the first interconnect structure 1102. Additionally, the interconnects may provide for multiple interconnect zones. Connecting the multiple interconnect zones may help to dissipate heat from the circuit components or devices of the multiple functional sections.

Additionally, a second interconnect structure (i.e., a second interconnect) 1102' is formed between second select ones of the electrical connections in the second section 130 (i.e., first via structures), conductive structure 137' (i.e., a second via structure), conductive structure 1141' (i.e., a third via structure), second select ones of the electrical connections in the third section 170 (i.e., first via structures), conductive structure 177' (i.e., a second via structure), and second select ones of the electrical connections in the fourth section 150 (i.e., first via structures).

Additionally, a third interconnect structure (i.e., a third interconnect) 1102" is formed between third select ones of the electrical connections in the first section 120 (i.e., first via structures), conductive structure 137" (i.e., a second via structure), third select ones of the electrical connections in the second section 130 (i.e., first via structures), conductive structure 1141" (i.e., a third via structure), conductive structure 177" (i.e., a second via structure), and third select ones of the electrical connections in the third section 170 (i.e., first via structures).

Further, a fourth interconnect structure (i.e., a fourth interconnect) 1102''' is formed between TSV structure 114''' (i.e., a fourth via structure), fourth select ones of the electrical connections in the first section 120 (i.e., first via structures), conductive structure 137''' (i.e., a second via structure), fourth select ones of the electrical connections in the second section 130 (i.e., first via structures), conductive structure 1141''' (i.e., a third via structure), fourth select ones of the electrical connections in the third section 170 (i.e., first via structures), conductive structure 177''' (i.e., a second via structure), and fourth select ones of the electrical connections in the fourth section 150 (i.e., first via structures).

In one embodiment, a predetermined distance of between about eight micrometers (μm) and about twelve μm exists between the first and second surfaces of the first silicon layer 110. Additionally, in one embodiment, a predetermined distance of between about six μm and about eight μm exists between the first and second surfaces of each of the first, second, third and fourth sections 120, 130, 170, 150. Further, in one embodiment, a predetermined distance of between about one μm and about three μm exists between the first and second surface of via joining layer 1140. The predetermined distances may, for example, correspond to a height or thickness of the layers (i.e., first silicon layer 110, via joining layer 140) and sections (i.e., first section 120, second section 130, third section 170 and fourth section 150).

Additionally, in one embodiment, first section 120 and second section 130 are each provided as part of a first semiconductor structure, and third section 170 and fourth section 150 are each provided as a part of a second semiconductor structure. In such embodiment, the via joining layer 1140 electrically couples the first semiconductor structure and the second semiconductor structure to form a multi-layer semiconductor device (i.e., semiconductor device 1100) which includes at least two semiconductor structures. Additional aspects of multi-layer semiconductor device including at least two semiconductor structures are described in the above-referenced International Application No. PCT/US2015/044608, which is assigned to the assignee of the present disclosure and incorporated herein by reference in its entirety.

Figure 1B:
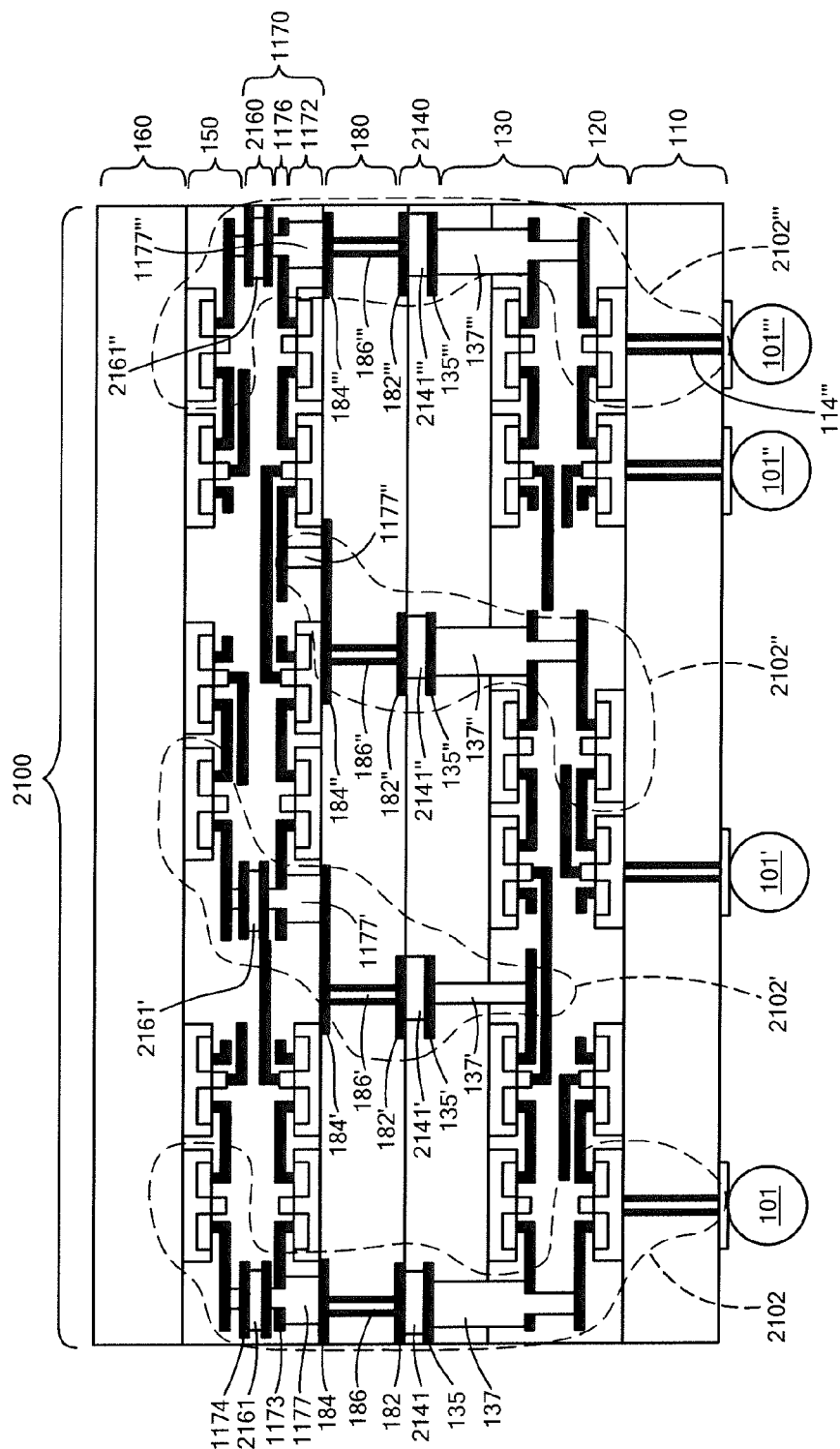
FIG. 1B is a block diagram of an example multi-layer semiconductor device including a plurality of sections, a plurality of silicon layers, and a plurality of via joining layers.

Referring now to FIG. 1B, another example multi-layer semiconductor device 2100 fabricated using a combination of substrate and via structures and fabrication techniques is shown. Semiconductor device 2100 includes fusible coupling structures 101, 101', 101", and 101''' and first silicon layer 110. Semiconductor device 2100 also includes first section 120, second section 130, fourth section 150, and silicon layer 160 (here, third silicon layer 160).

In the illustrated embodiment, semiconductor device 2100 additionally includes a third section 1170, a second silicon layer 180, a via joining layer 2140 and a via joining layer 2160. The third section 1170 (i.e., a tier-3 functional section) has first and second opposing surfaces and is fabrication using bulk semiconductor fabrication techniques (e.g., similar to first section 120) (e.g., to provide for a semiconductor device which includes functional sections fabricated using a combination of fabrication techniques, technologies and/or materials). The first surface of the third section 1170 is disposed over and coupled to the second surface of the fourth section 150.

The third section 1170 includes a device layer 1172 which may be the same as or similar to device layer 122 of second section 120. The third section 1170 also includes an insulating layer 1176 which may be the same as or similar to insulating layer 126 of first section 120. A first surface of the insulating layer 1176 corresponds to the first surface of the third section 1170, and a second surface of the device layer 1172 corresponds to the second surface of the third section 1170 in the illustrated embodiment. Similar to device layer 122 of first section 120, device layer 1172 of third section 1170 has a plurality of electrical connections (e.g., 1173), or "first" via structures, extending between first and second surfaces of the device layer 1172. Device layer 1172 also includes a plurality of circuit devices (e.g., 1174) disposed between the first and second surfaces of the device layer 1172.

A plurality of conductive structures (here, conductive structures 1177, 1177', 1177" and 1177''') fabricated using via-last techniques, for example, are formed in select portions of the third section 1170 and/or the fourth section 150. The conductive structures 1177, 1177', 1177" and 1177''', or "second" via structures, which may be micro-vias in the third section 1170 and/or the fourth section 150, for example, form one or more electrical connections between the third section 1170 and the fourth section 150 (e.g., in conjunction with conductive structures 2161, 2161', and 2161" of via joining layer 2160, as will be discussed). Additionally, the conductive structures 1177, 1177', 1177" and 1177''' (e.g., through oxide via (TOV) or through insulator via (TIV) structures) each have a portion which is electrically coupled to second surfaces of corresponding interconnect pads of the second silicon layer 180, as will be discussed.

A via joining layer 2160 having first and second opposing surfaces is disposed between and coupled to the first surface of third section 1170 and the second surface of fourth section 150. The via joining layer 2160 includes a plurality of via joining layer conductive structures (here, conductive structures 2161, 2161', 2161", and 2161'''), or "third" via structures. The via joining layer 2160 may also include one or more portions. As one example, the via joining layer 2160 may include first and second portions fabricated using via-last techniques. The first and second portions may each be coupled and converted to a partial via first structure before bonding.

Conductive structure 1177 is electrically coupled to conductive structure 2161 of via joining layer 2160, and forms an electrical connection between at least the first select ones of the electrical connections in the third section 1170 and first select ones of the electrical connections in the fourth section 150. Additionally, conductive structure 1177' is electrically coupled to conductive structure 2161' of via joining layer 2160, and forms an electrical connection between at least second select ones of the electrical connections in the third section 1170 and second select ones of the electrical connections in the fourth section 150. Additionally, conductive structure 1177" extends from and forms an electrical connection with at least third select ones of the electrical connections in the third section 1170. Further, conductive structure 1177''' is electrically coupled to conductive structure 2161" of via joining layer 2160, and forms an electrical connection between at least fourth select ones of the electrical connections in the third section 1170 and fourth select ones of the electrical connections in the fourth section 150.

The second silicon layer 180, which may be the same as or similar to first silicon layer 110 in some embodiments, has a surface (i.e., a second surface) which is disposed beneath the second surface of third section 1170. The second silicon layer 180 includes a first plurality of interconnect pads (here, interconnect pads 182, 182', 182", and 182''') which are disposed over or beneath select portions of a first surface of the second silicon layer 180. Additionally, the second silicon layer 180 includes a second plurality of interconnect pads (here, interconnect pads 184, 184', 184", and 184''') which are disposed over or beneath select portions of a second surface of the second silicon layer 180.

The second silicon layer 180 also includes a plurality of through silicon via (TSV) structures (here, TSV structures 186, 186', 186", and 186''') which extend between select portions of the first and second surfaces of the second silicon layer 180. The TSV structures 186, 186', 186", and 186''' are electrically coupled to first surfaces of interconnect pads 182, 182', 182", and 182''' and interconnect pads 184, 184', 184", and 184''', respectively, to provide a corresponding plurality of electrical connections between the first and second surfaces of the second silicon layer 180. Additionally, interconnect pads 184, 184', 184", and 184'" are electrically coupled to conductive structures 1177, 1177', 1177" and 1177'", respectively.

In general, there are multiple possible TSV structures which may be provided in the multi-layer semiconductor devices disclosed herein (e.g., semiconductor device 2100). In one embodiment, TSV structures fabricated inside or distal to the first and second surfaces of the semiconductor device (e.g., TSV structures 186, 186', 186", and 186'") may need to be coupled to at least one via last and/or at least one via first conductive structure. These TSV structures can be TSV via-first, via last-TSV-via first, and/or via last-TSV-via last. In contrast, TSV structures fabricated proximate to the first and second surfaces of the semiconductor device (e.g., TSV structures 114, 114', 114", and 114'") may not need to be coupled to at least one via last and/or at least one via first conductive structure.

In one embodiment, the second silicon layer 180 has a same thickness as the first silicon layer 110, which may provide for TSV structures having a same size and pitch. In another embodiment, the second silicon layer 180 has a thickness which is less than a thickness of the first silicon layer 110. In such embodiment, the second silicon layer 180 may have smaller TSV structures (e.g., TSV structures having a diameter of between about five micron and about twenty micron) than the first silicon layer 110. This may provide for a higher density semiconductor device with an even smaller possible active area cross section. Additionally, in one embodiment, the second silicon layer 180 has a first pitch (e.g., a pitch of between about ten micron and about twenty micron), while the first silicon layer 110 has a second, different pitch which is suitable for attaching with micro bumps or a ball grid array of a larger pitch structure (e.g., a structure having a pitch between about one hundred micron and about two hundred micron).

A via joining layer 2140 having first and second opposing surfaces is disposed between and coupled to the first surface of second silicon layer 180 and the second surface of second section 130. The via joining layer 2140 includes a plurality of via joining layer conductive structures (here, conductive structures 2141, 2141', 2141", and 2141'"), or "third" via structures, for electrically coupling the second silicon layer 180 to the second section 130. The via joining layer 2140 may also include one or more portions. As one example, the via joining layer 2140 may include first and second portions fabricated using via-last techniques. The first and second portions may each be coupled and converted to a partial via first structure (e.g., a partial via structure fabricated on a TSV) before bonding.

Conductive structure 2141 extends from and forms an electrical connection between the second surface of interconnect pad 135 of second section 130, and the second surface of interconnect pad 182 of second silicon layer 180. Additionally, conductive structure 2141' extends from and forms an electrical connection between the second surface of interconnect pad 135' of second section 130, and the second surface of interconnect pad 182' of second silicon layer 180. Additionally, conductive structure 2141" extends from and forms an electrical connection between the second surface of interconnect pad 135" of second section 130, and the second surface of interconnect pad 182" of second silicon layer 180. Further, conductive structure 2141'" extends from and forms an electrical connection between the second surface of interconnect pad 135'" of second section 130, and the second surface of interconnect pad 182'" of second silicon layer 180.

In the illustrated embodiment, a plurality of interconnect structures (here, interconnect structures 2102, 2102', 2102" and 2102'"), each including two or more via structures, are formed in semiconductor device 2100. A first interconnect structure (i.e., a first interconnect) 2102 is formed between TSV structure 114 (i.e., a fourth via structure), first select ones of the electrical connections in the first section 120 (i.e., first via structures), conductive structure 137 (i.e., a second via structure), first select ones of the electrical connections in the second section 130 (i.e., first via structures), conductive structure 2141 (i.e., a third via structure), TSV structure 186 (i.e. a fourth via structure), conductive structure 1177 (i.e., a second via structure), first select ones of the electrical connections in the third section 1170 (i.e., first via structures), conductive structure 2161 (i.e., a third via structure), and first select ones of the electrical connections in the fourth section 150 (i.e., first via structures) (e.g., to provide for a semiconductor device which includes functional sections fabricated using a combination of fabrication techniques, technologies and/or materials).

Additionally, a second interconnect structure (i.e., a second interconnect) 2102' is formed between second select ones of the electrical connections in the second section 130 (i.e., first via structures), conductive structure 137' (i.e., a second via structure), conductive structure 2141' (i.e., a third via structure), TSV structure 186' (i.e., a fourth via structure), conductive structure 1177' (i.e., a second via structure), second select ones of the electrical connections in the third section 1170 (i.e., first via structures), conductive structure 2161' (i.e., a third via structure), and second select ones of the electrical connections in the fourth section 150 (i.e., first via structures).

Additionally, a third interconnect structure (i.e., a third interconnect) 2102" is formed between third select ones of the electrical connections in the first section 120 (i.e., first via structures), conductive structure 137" (i.e., a second via structure), third select ones of the electrical connections in the second section 130 (i.e., first via structures), conductive structure 2141" (i.e., a third via structure), TSV structure 186" (i.e., a fourth via structure), conductive structure 1177" (i.e., a second via structure), and third select ones of the electrical connections in the third section 1170 (i.e., first via structures).

Further, a fourth interconnect structure (i.e., a fourth interconnect) 2102'" is formed between TSV structure 114'" (i.e., a fourth via structure), fourth select ones of the electrical connections in the first section 120 (i.e., first via structures), conductive structure 137'" (i.e., a second via structure), fourth select ones of the electrical connections in the second section 130 (i.e., first via structures), conductive structure 2141'" (i.e., a third via structure), TSV structure 186'" (i.e., a fourth via structure), conductive structure 1177'" (i.e., a second via structure), fourth select ones of the electrical connections in the third section 1170 (i.e., first via structures), conductive structure 2161' (i.e., a third via structure), and fourth select ones of the electrical connections in the fourth section 150 (i.e., first via structures).

Additional semiconductor devices and interconnect structures formed by using a combination of substrate and via structures and fabrication techniques, are described in conjunction with the figures below.

Figure 2:
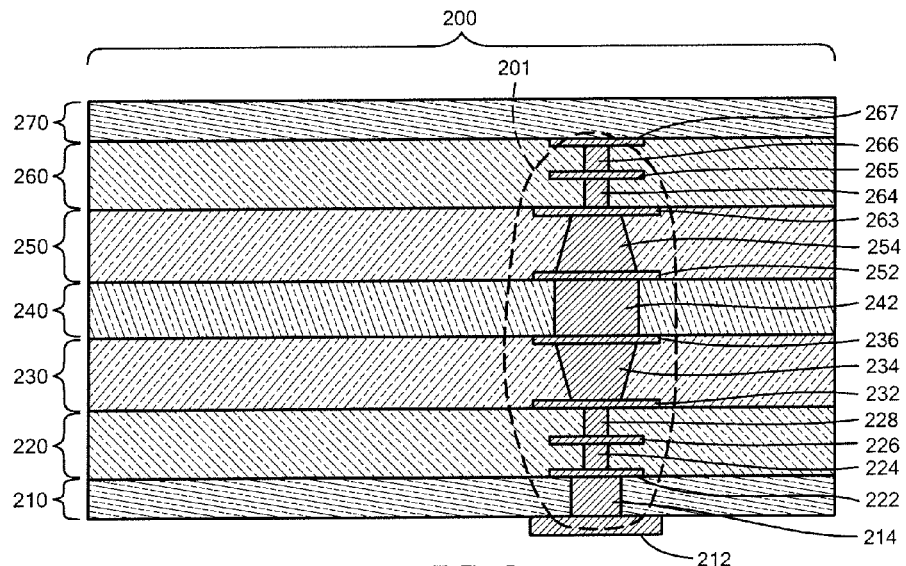
FIGS. 2-2J are block diagrams of example multi-layer semiconductor devices and corresponding interconnect structures.
Figure 2A:
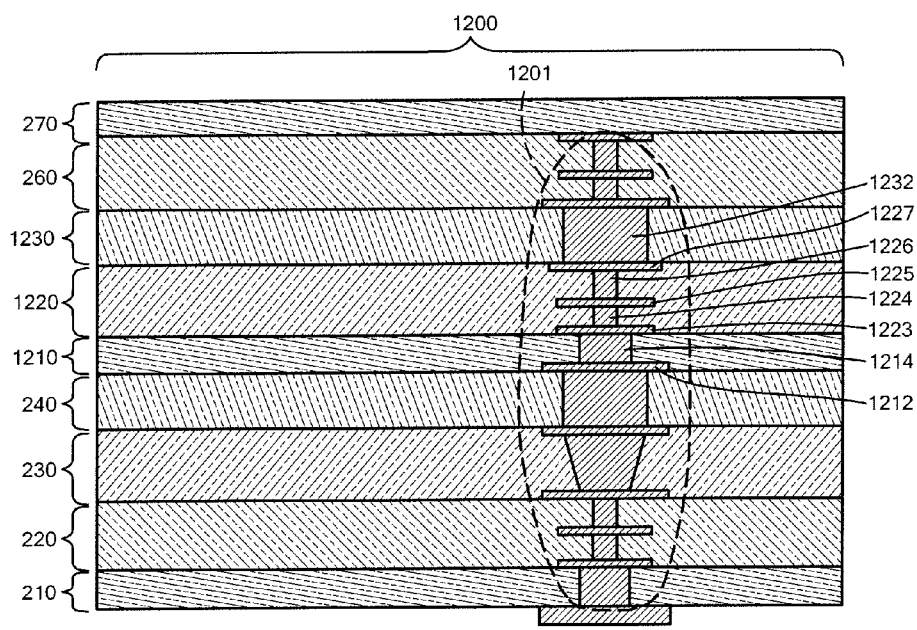
Figure 2B:
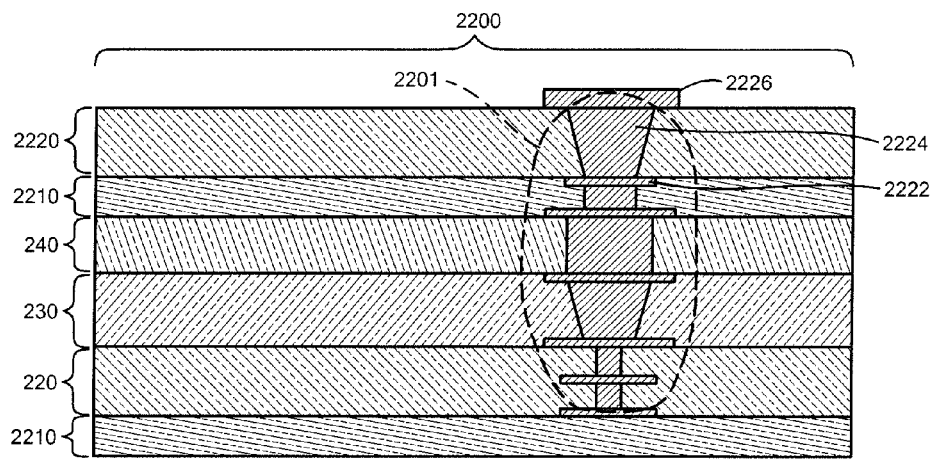
Figure 2C:
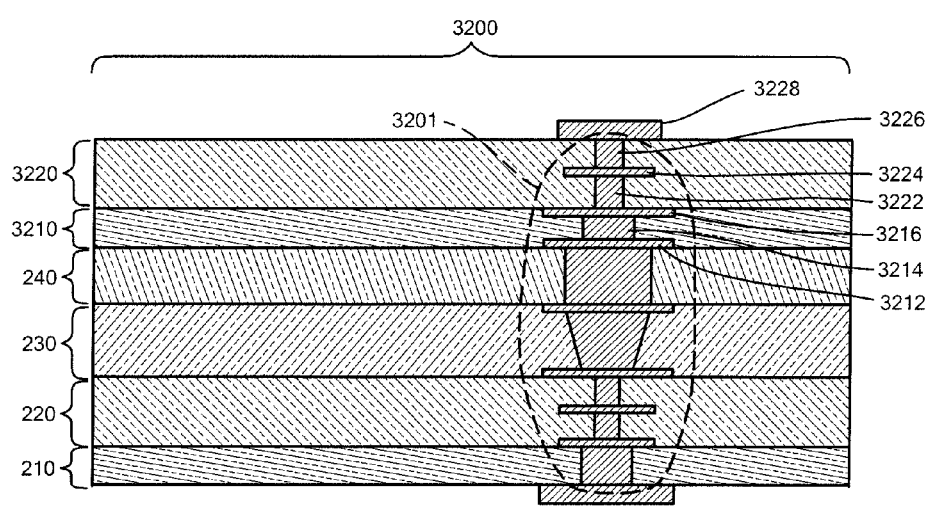
Figure 2D:
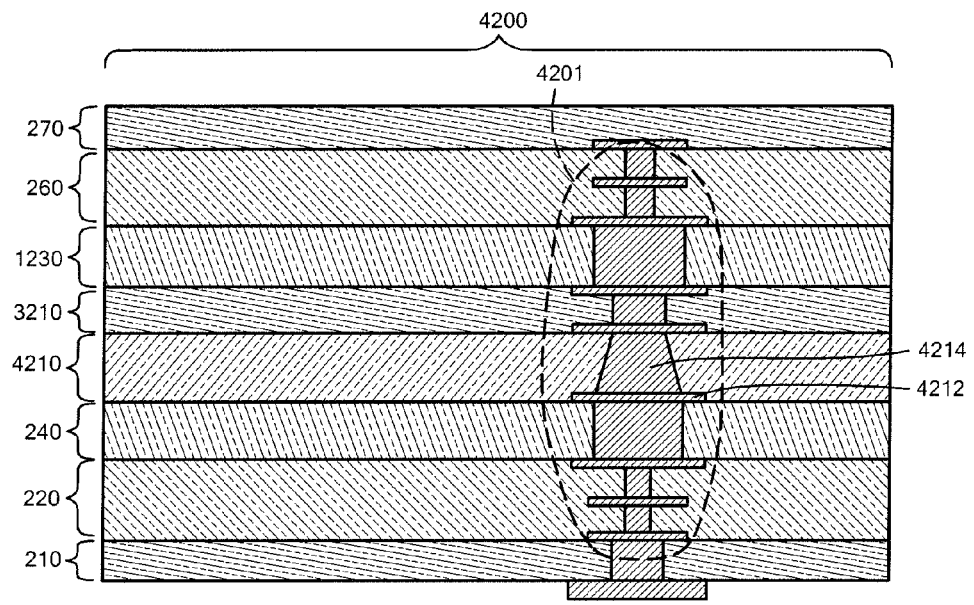
Figure 2E:
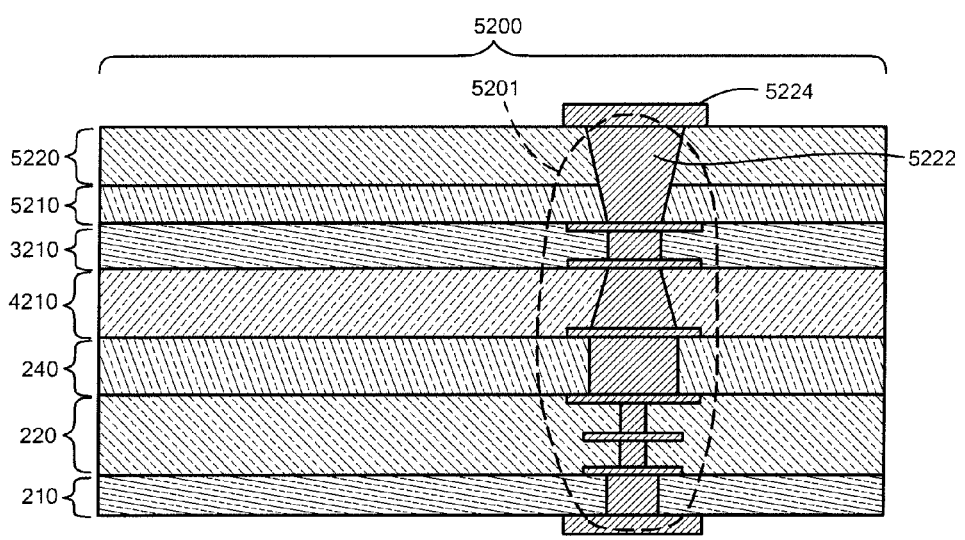
Figure 2F:
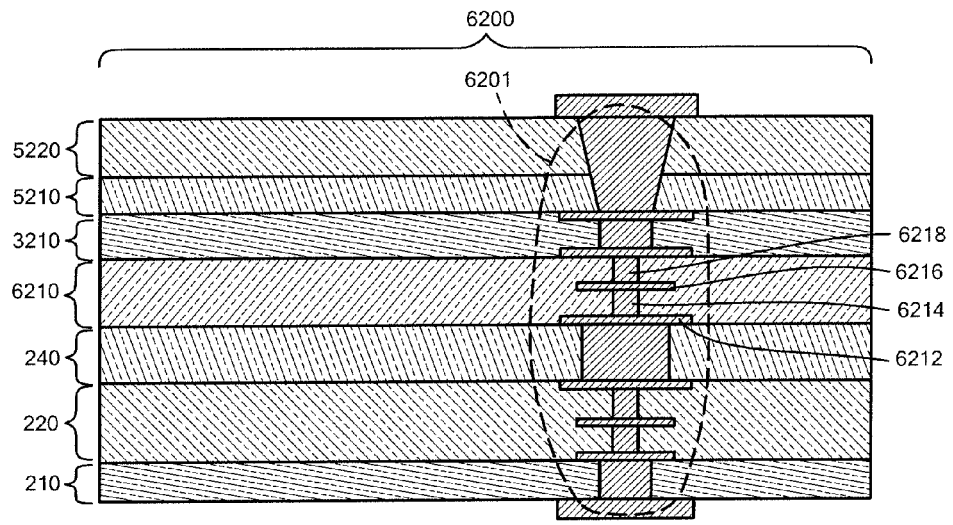
Figure 2G:
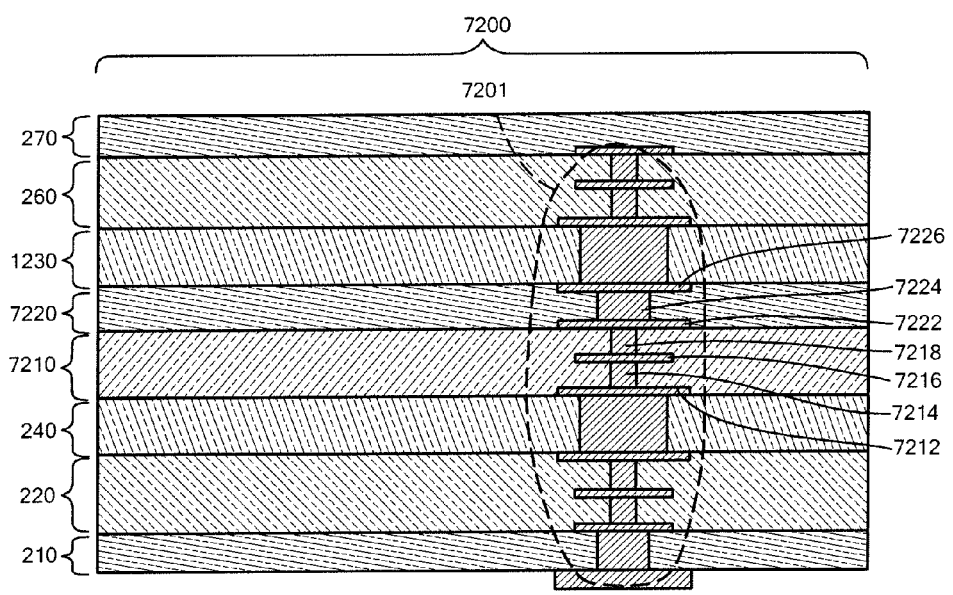
Figure 2H:
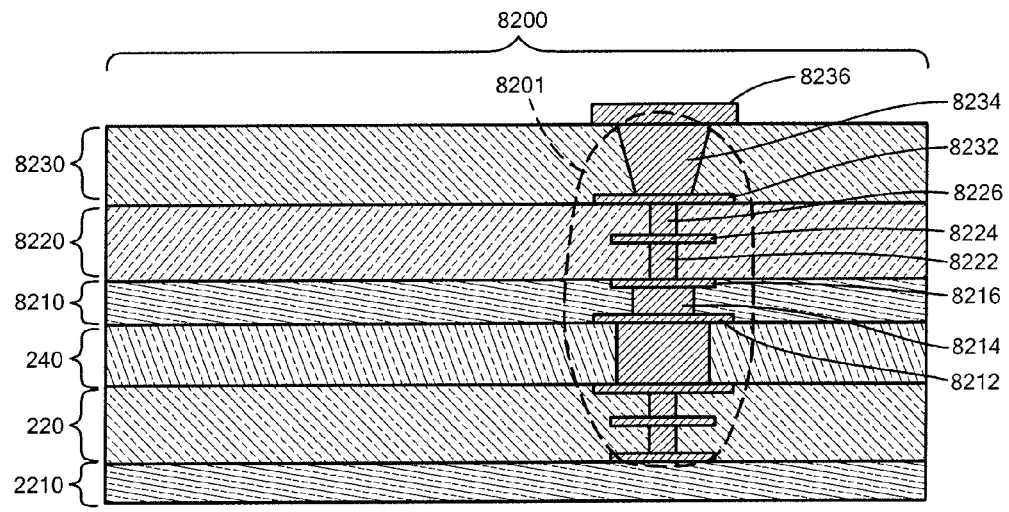
Figure 2I:
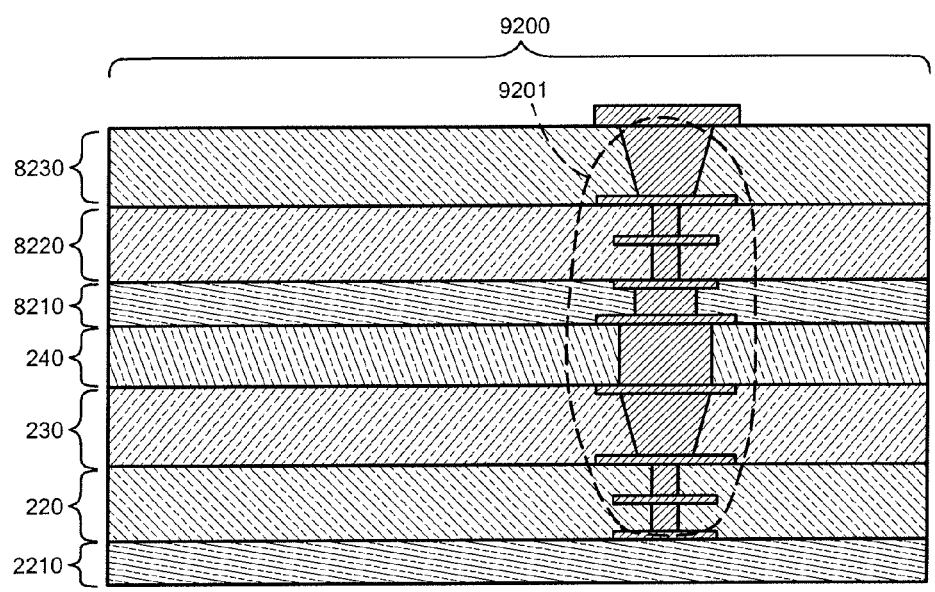
Figure 2J:
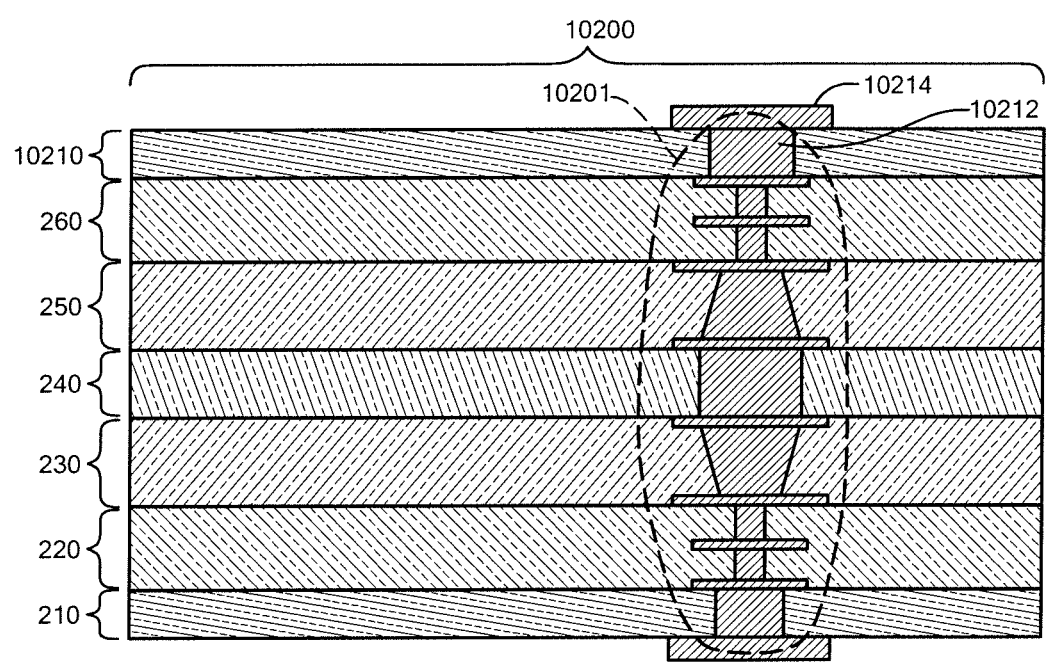

Referring now to FIGS. 2-2J, example multi-layer semiconductor devices, and corresponding interconnect structures, as may be provided in an example method for fabricating a multi-layer semiconductor device in accordance with the concepts, systems, circuits and techniques sought to be protected herein are shown. While each of the semiconductor devices (e.g., 200, as will be discussed) is shown as including a particular number of sections (e.g., functional sections or tiers) and layers (e.g., silicon layers and via joining layers), and a particular arrangement of sections and layers, it should, of course, be appreciated that other configurations are also possible. Additionally, while each of the sections (e.g., 220, as will be discussed) is shown as including a single layer, a single layer is shown to promote simplicity, clarity and understanding in the drawings and is not intended to be, and should not be construed, as limiting. The sections may, of course, include more than a single layer (e.g., similar to the sections discussed above in conjunction with FIGS. 1-1B).

Referring now to FIG. 2, an example multi-layer semiconductor device 200 which has similar layer and section arrangements as semiconductor device 1100 of FIG. 1A is shown. Semiconductor device 200 includes a first silicon layer 210, a first section (e.g., a tier-1 functional section) 220 and a second section (e.g., a tier-2 functional section) 230, each having first and second opposing surfaces. The first surface of the first section 220 is disposed over and coupled to the second surface of the first silicon layer 210, and the first surface of the second section 230 is disposed over and coupled to the second surface of the first section 220. First silicon layer 210 includes an interconnect pad 212, first section 220 includes interconnect pads 222, 226, and third section 230 includes interconnect pads 232, 236.

Semiconductor device 200 also includes a via joining layer 240, a third section (e.g., a tier-3 functional section) 250, a fourth section (e.g., a tier-4 functional section) 260, and a second silicon layer 270, each also having first and second opposing surfaces. The first surface of the via joining layer 240 is disposed over and coupled to the second surface of second section 230, and the first surface of the third section 250 is disposed over and coupled to the second surface of the via joining layer 240. Additionally, the first surface of the fourth section 260 is disposed over and coupled to the second surface of third section 250, and the first surface of the second silicon layer 270 is disposed over and coupled to the second surface of the fourth section 260. Third section 250 includes interconnect pads 252, 256, and fourth section 260 includes interconnect pads 264, 268. First section 220 and fourth section 260 are each fabricated using bulk semiconductor fabrication techniques, and second section 230 and third section 250 are each fabricated using at least SOI fabrication techniques in the illustrated embodiment.

In the illustrated embodiment, both first section 220 and fourth section 260 are "protected" by Si (e.g., first silicon layer 210 for first section 220, and second silicon layer 270 for fourth section 260). First section 220 is fabricated directly on first silicon layer 210 which may, for example, not be completely etched prior to coupling. Similarly, fourth section 260 can be grown and fabricated directly on second silicon layer 270. For second section 230 and fourth section 260, handle Si is etched substantially completely and an oxide or insulator material is deposited as an Si etch stop to protect the second section 230 and fourth section 260.

Semiconductor device 200 also includes an interconnect structure 201 which extends through each of first silicon layer 210, first section 220, second section 230, via joining layer 240, third section 250 and fourth section 260. The interconnect structure 201, which may be the same as or similar to interconnect structures 1102 and 1102''' of semiconductor device 1100 of FIG. 1A, for example, includes a plurality of via structures (here, eight via structures).

A first one of the via structures 214 (i.e., a first via structure 214) of interconnect structure 201 extends from and forms an electrical connection between a second surface of interconnect pad 212 of first silicon layer 210, and a first surface of interconnect pad 222 of first section 220. Additionally, a second one of the via structures 224 (i.e., a second via structure 224) extends from and forms an electrical connection between a second surface of interconnect pad 222 of first section 220 and a first surface of interconnect pad 226 of first section 220. Further, a third one of the via structures 228 (i.e., a third via structure 228) extends from and forms an electrical connection between a second surface of interconnect pad 226 of first section 220, and a first surface of interconnect pad 232 of second section 230. In the illustrated embodiment, first via structure 214 is provided as a TSV structure, and the second and third via structures 224, 228 are each provided as TOV or TIV structures. In the illustrated embodiment, second via structure 224 and third via structure 228 are each provided as two sub-micro and/or micro via structures with an average diameter ranging from about two hundred nm to about one thousand nm. Second via structure 224 and third via structure 228 can also be provided as a single and/or multiple via structures which are stacked and/or staggered to create an electrical connection between interconnect pad 222 and interconnect pad 232. It is further possible that second via structure 224 and third via structure 228 are isolated with second via structure 224 being connected with interconnect pad 222 and third via structure 228 being connected with interconnect pad 232.

A fourth one of the via structures 234 (i.e., a fourth via structure 234) of interconnect structure 201 extends from and forms an electrical connection between a second surface of interconnect pad 232 of second section 230, and a first surface of interconnect pad 236 of second section 230. Additionally, a fifth one of the via structures 242 (i.e., a fifth via structure 242) extends from and forms an electrical connection between a second surface of interconnect pad 236 of second section 230, and a first surface of interconnect pad 252 of third section 250. Further, a sixth one of the via structures 254 (i.e., a sixth via structure 254) extends from and forms an electrical connection between a second surface of interconnect pad 252 of third section 250, and a first surface of interconnect pad 263 of fourth section 260. In the illustrated embodiment, the fourth, fifth and sixth via structures 234, 242, 254 are each provided as TOV or TIV structures.

In one embodiment, fourth via structure 234 is provided as a single micro via with average via diameter of between about one micron and about four micron. It is possible that fourth via structure 234 can be electrically connected and/or surrounded vertically by multiple micro and/or sub-micro via similar to second via structure 224 and third via structure 228. It is further possible that fourth via structure 234 can be electrically connected and/or surrounded by active and/or passive circuits. Additionally, in one embodiment, part of the fifth via structure 242 is initially created on top of interconnect pad 236 with interconnect pad 236 being an interconnect pad structure for fourth via structure 234. Additionally, in one embodiment, part of fifth via structure 242 is surrounded by single or multiple dielectric layers with a specific top self-bondable dielectric. Further, part of fifth via structure 242 can be on same level and/or below and/or above a bondable oxide surface of the functional section before bonding. Fifth via structure 242 may be formed by joining two bondable dielectric materials and subsequently treating these materials (e.g., through an annealing process). Fifth via structure 242 may have an average of between about one micron and about three micron. Fifth via structure 242 may also have a diameter which can be smaller than a diameter of fourth via structure. Fifth via structure 242 may additionally have a smaller height than fourth via structure 234. Fifth via structure 242 may further be surrounded by single and or multilayer dielectrics whereas fourth via structure 234 and sixth via structure 254 may be surrounded by a single dielectric and multiple submicro vias.

A seventh one of the via structures 264 (i.e., a seventh via structure 264) of interconnect structure 201 extends from and forms an electrical connection between a second surface of interconnect pad 263 of fourth section 260, and a first surface of interconnect pad 265 of fourth section 260. Additionally, an eighth one of the via structures 266 (i.e., an eighth via structure 266) extends from and forms an electrical connection between a second surface of interconnect pad 265 of fourth section 260, and a first surface of interconnect pad 267 of fourth section 260. In the illustrated embodiment, the seventh and eight via structures 264, 266 are each provided as TOV or TIV structures. In one embodiment, seventh via structure 264 and eighth via structure 266 may be provided as sub-micro and/or micro via structures with average diameter ranging from about two hundred nm and bout one thousand nm. Additionally, in one embodiment, seventh via structure 264 and/or eighth via structure 266 can be provided as single and/or multiple via structures which are stacked and/or staggered to create an electrical connection between interconnect pad 263 and interconnect pad 267. Seventh via structure 264 and eighth via structure 266 may be isolated with eighth via structure 266 being coupled to interconnect pad 267 and seventh via structure 264 being coupled to interconnect pad 263.

As illustrated, the interconnect pads (e.g., 212) and via structures (e.g., 214) may come in a variety of sizes, shapes and forms. Via structure 214 may, for example, have an average diameter between about one micron and about one hundred micron. Additionally, the size of interconnect pad 212 may depend upon the diameter of via structure 214 via diameter. For a fifty to seventy five micron interconnect pad 212, for example, via structure 214 may have a diameter between about ten micron and about twenty micron. A larger diameter via structure 214 via is preferred for a thicker interconnect pad 212. Size and shape of the interconnect pads (e.g., 212) may, for example, be selected based upon diameter and/or pitch of one or more of the via structures (e.g., 214) which are to be electrically coupled to the interconnect pads (e.g., 212).

Interconnect pad 212 may be provided as a multiple metal layer interconnect pad structure. As one example, interconnect pad 212 may be provided from Ti/Al/Ti/Pt/Au, Ti/Al—Cu(10% or less), Ti/Al/Ni/Au, or Ti/Al/Pd/Au. Additionally, in one embodiment, interconnect pad 212 has a thickness which is greater than the rest of the interconnect pads in interconnect structure 201. As one example, interconnect pad 212 can have a thickness of about five hundred nm and the rest of the interconnect pads in interconnect structure 201 have a thickness of between about one hundred nm and about two hundred nm.

Additionally, diameter and/or pitch of the via structures (e.g., 234) may, for example, be selected based upon space availability in the corresponding section or layer. In one embodiment, part of the interconnect structure 201 (e.g., 234, 254, sometimes also 212 and 242) are preferred to be isolated from active circuits (e.g., transistors) to minimize or eliminate mechanical and/or electrical issue of the semiconductor device 200. In the illustrated embodiment, a first portion of via structure 234 has first dimensions and a second opposing surface of via structure 234 has second, different dimensions. Additionally, a first portion of via structure 254 has first dimensions and a second opposing surface of via structure 254 has second, different dimensions. In one embodiment, semiconductor device 200 is provided having a single interconnect structure 201 with multiple interconnect sections. Each interconnect section can have same or different size and composition. For example, interconnect structure 201 can have the following sections to create a single interconnect: single and/or multiple submicron via-via last-via first-via last-single and or multiple submicron via-TSV. Interconnect 201 will create thinnest possible active area cross section for a device having four functional sections with two bulk and two SOI functional section.

Referring now to FIG. 2A, an example multi-layer semiconductor device 1200 which has similar layer and section arrangements as semiconductor device 2100 of FIG. 1B is shown. Semiconductor device 1200 includes first silicon layer 210, first section 220 and second section 230. Semiconductor device 1200 also includes via joining layer 240, fourth section 260, and a silicon layer 270 (here, third silicon layer 270).

In the illustrated embodiment, semiconductor device 1200 additionally includes a second silicon layer 1210, a third section (e.g., a tier-3 functional section) 1220, and a via joining layer 1230, each having first and second opposing surfaces. The first surface of the second silicon layer 1210 is disposed over and coupled to the second surface of the via joining layer 240, and the first surface of the third section 1220 is disposed over and coupled to the second surface of the second silicon layer 1210. Additionally, the first surface of the via joining layer 1230 is disposed over and coupled to the second surface of the third section 1220, and the second surface of the via joining layer 1230 is disposed beneath and coupled to the first surface of the fourth section 260. Second silicon layer 1210 includes interconnect pad 1212, and third section 1220 includes interconnect pads 1223, 1225, 1227. Additionally, first section 220, third section 1220 and fourth section 260 are each fabricated using bulk semiconductor fabrication techniques, and second section 230 is fabricated using at least SOI fabrication techniques in the illustrated embodiment.

Additionally, in the illustrated embodiment, first section 220, third section 1220 and fourth section 260 are each provided as functional sections protected by Si (e.g., silicon layer 210 for first section 220, silicon layer 1210 for third section 1220 and silicon layer 270 for fourth section 260). First section 220 is fabricated directly on silicon layer 210 which may not be completely etched. A TSV is used for connecting first section 220. Similarly for fourth section 260, the fourth section 260 can be grown and fabricated directly on silicon layer 270.

For second section 230 and fourth section 260, handle Si is etched substantially completely and an oxide or insulator material is deposited as a Si etch stop to protect second section 230 and fourth section 260. FIG. 2A shows a multilayer semiconductor device 1200 with three bulk functional sections (220, 1220, 260) and one SOI functional section (230). FIG. 2 shows a multilayer semiconductor device 200 with two bulk functional sections (220, 260) and two SOI functional section (230, 250). SOI functional sections (250) in FIG. 2 may be replaced with one or more bulk functional sections (1220), as shown in FIG. 2A, for example.

Adding bulk functional section anywhere between top and bottom functional sections within a semiconductor device may require a TSV structure for an electrical connection in accordance with embodiments described herein. In general, a multilayer semiconductor device having "n" number of bulk functional sections may require "(n−1)" number of TSV layers to create a flip-chip and/or a wirebond attachable device. Alternatively, a multilayer semiconductor device having "n" number of bulk functional section may require "n" number of TSV layers to create an interposer type device where top and bottom portions of the device are available for flip-chip and/or wirebonding.

Semiconductor device 1200 also includes an interconnect structure 1201 which extends through each of first silicon layer 210, first section 220, second section 230, via joining layer 240, second silicon layer 1210, third section 1220, via joining layer 1230 and fourth section 260. The interconnect structure 1201, which may be the same as or similar to interconnect structures 2102 and 2102''' of semiconductor device 2100 of FIG. 1B, for example, includes a plurality of via structures (here, eleven via structures).

Interconnect structure 1201 includes via structures 214, 224, 228, 234, 242, 264 and 266. Interconnect structure 1201 also includes a via structure 1214 which extends from and forms an electrical connection between a second surface of interconnect pad 1212 of second silicon layer 1210, and a first surface of interconnect pad 1223 of third section 1220. Interconnect structure 1201 additionally includes a via structure 1224 which extends from and forms an electrical connection between a second surface of interconnect pad 1223 of third section 1220, and a first surface of interconnect pad 1225 of third section 1220. Interconnect structure 1201 further includes a via structure 1226 which extends from and forms an electrical connection between a second surface of interconnect pad 1225 of third section 1220, and a first surface of interconnect pad 1227 of third section 1220.

Interconnect structure 1201 also includes a via structure 1232 which extends from and forms an electrical connection between a second surface of interconnect pad 1227 of third section 1220, and a first surface of interconnect pad 263 of fourth section 260. Via structures 1214, 1224, 1226 and 1232 are each provided as either through oxide via (TOV), through insulator via (TIV), or through silicon via (TSV) structures in the illustrated embodiment.

In one embodiment, a semiconductor device 1200 having a thinnest possible active are cross section includes multiple functional sections (e.g., 220, 230, 1220, 260) coupled with each other using through oxide via (via last and/or via first) and/or through silicon via bonding where each functional section can have single or multiple metal layers connected with each other by sub-micron via. Each functional section (except bottom and/or top functional sections of semiconductor device 1200) consists of at least two different vias confined within dialectic layers. First sub-micron vias (e.g. 100-500 nm diameter) may be used to interconnect between layers of each functional section. Additionally, second micro vias (e.g., 1-3 micron) may be used to interconnect between two functional sections. The second micro vias may consist of a deep and shallow via which is larger in size and pitch than the first micro via. The second micro via can have a variable/tunable via diameter from top to bottom depending on space availability. For example, the second micro via can have a one urn diameter at the base and a two um diameter at the top.

Each via may be fully or partially filled with a multilayer metal and or alloy. Example metal stack-ups for the vias include: Ti/TiN/W, Ti/W, Ti/Cu, and Ti/Ni/Cu. Each functional section may have at least one common dielectric (e.g., Silicon oxide). Additionally, each functional section except the first section may be required to be covered with an insulating layer with a second micro via being formed through the insulation layer. In one embodiment, the first functional section requires only a top insulation layer for a second micro via. Materials stack-up for each functional section can be same or different from each other. Each functional section can be at least a part of individual or multiple devices. In one embodiment, one or more of the functional sections can have an active transistor layer and two local interconnect routing layers for each active transistor layer. Bonding of multiple functional section allows for the mixing of III-V transistors with Silicon CMOS, for example (e.g., Si+GaN for RF circuits, Si+III-V finFETs for high performance digital circuits, and Si+III-V TFETs for low power digital circuits).

Further, in one embodiment, each functional section has a bondable dielectric material disposed over or provided as part of the functional section. The bondable dielectric material may have a similar thickness and surfaces roughness between functional sections. Thickness of each functional section can be similar or different. Example thickness of functional sections are between about six um and about ten urn. A semiconductor device 1200 having thinnest possible active area cross section is made with multiple functional sections (220, 230, 1220, 260) coupled with each other by combination of parallel and sequential process. Each functional section may be created separately on a Si wafer and then coupled with each other either by parallel processes and/or sequential processes. In the illustrated embodiment, section 260 and 1220 may be fabricated using parallel processes, sections 230 and 220 may be fabricated using sequential processes, and sections 260-1220 and section 220-230 may be combined using parallel processes to create semiconductor device 1200. In general, parallel processes use via first approaches and do not require post processing to create interconnects between functional sections. Sequential processes, for example, use via last approaches which requires the creation of interconnects after bonding the functional sections.

In one embodiment, semiconductor device 1200 includes a single interconnect structure 1201 having multiple interconnect sections. Each interconnect section can have a same or different size and composition. For example, interconnect structure 1201 can have the following sections to create a single interconnect: single and or multiple submicron via-via first-single and or multiple submicron via-TSV-via first-via last-single and or multiple submicron via-TSV. The interconnect structure 1201 may create thinnest possible active area cross section for a device having four functional sections with three bulk (260,1220,220) and one SOI (230) functional section.

Referring now to FIG. 2B, an example multi-layer semiconductor device 2200 includes first section 220, second section 230, via joining layer 240, and second silicon layer 1210. In the illustrated embodiment, semiconductor device 2200 also includes a silicon layer 2210 (here, first silicon layer 2210) and a third section (e.g., a tier-3 functional section) 2220, each having first and second opposing surfaces. The second surface of the first silicon layer 2210 is disposed beneath and coupled to the first surface of the first section 220. Additionally, the first surface of the third section 2220 is disposed over and coupled to the second surface of the second silicon layer 1210. Third section 2220 includes interconnect pads 2222, 2226. Additionally, first section 220 and third section 2220 are each fabricated using bulk semiconductor fabrication techniques, and second section 230 is fabricated using at least SOI fabrication techniques in the illustrated embodiment.

Semiconductor device 2200 additionally includes an interconnect structure 2201 which extends through each of first section 220, second section 230, via joining layer 240, second silicon layer 1210, and third section 2220. The interconnect structure 2201 includes a plurality of via structures (here, six via structures).

Interconnect structure 2201 includes via structures 224, 228, 234, 242, and 1214. Interconnect structure 2201 also includes a via structure 2224 which extends from and forms an electrical connection between a second surface of interconnect pad 2222 of third section 2220, and a first surface of interconnect pad 2226 of third section 2220. Via structure 2224 is provided as a TOV or TIV structure in the illustrated embodiment. In one embodiment, semiconductor device 2200 includes a single interconnect structure 2201 having multiple interconnect sections. Each interconnect section can have a same or different size and composition. For example, interconnect structure 2201 can have the following sections to create a single interconnect: via last-TSV-via first-via last-single and or multiple submicron via. The interconnect structure 2201 may create a thinnest possible active area cross section for a device having three functional sections with two bulk (2220, 220) and one SOI (230) functional section.

Referring now to FIG. 2C, an example multi-layer semiconductor device 3200 includes first silicon layer 210, first section 220, second section 230, and via joining layer 240. In the illustrated embodiment, semiconductor device 3200 also includes a silicon layer 3210 (here, second silicon layer 3210) and a third section (e.g., a tier-3 functional section) 3220, each having first and second opposing surfaces. The second surface of the second silicon layer 3210 is disposed over and coupled to the second surface of the via joining layer 240. Additionally, the first surface of the third section 3220 is disposed over and coupled to the first surface of the second silicon layer 3210. Second silicon layer 3210 includes interconnect pads 3212, 3214, and third section 3220 includes interconnect pads 3224, 3228. Additionally, first section 220 and third section 3220 are each fabricated using bulk semiconductor fabrication techniques, and second section 230 is fabricated using at least SOI fabrication techniques in the illustrated embodiment.

Semiconductor device 3200 additionally includes an interconnect structure 3201 which extends through each of first silicon layer 210, first section 220, second section 230, via joining layer 240, second silicon layer 3210, and third section 3220. The interconnect structure 3201 includes a plurality of via structures (here, eight via structures).

Interconnect structure 3201 includes via structures 214, 224, 228, 234, and 242. Interconnect structure 3201 also includes a via structure 3214 which extends from and forms an electrical connection between a second surface of interconnect pad 3212 of second silicon layer 3210, and a first surface of interconnect pad 3216 of second silicon layer 3210. Interconnect structure 3201 additionally includes a via structure 3222 which extends from and forms an electrical connection between a second surface of interconnect pad 3216 of second silicon layer 3210, and a first surface of interconnect pad 3224 of third section 3220. Interconnect structure 3201 further includes a via structure 3226 which extends from and forms an electrical connection between a second surface of interconnect pad 3224 of third section 3220, and a first surface of interconnect pad 3228 of third section 3220. Via structure 3214 is provided as a TSV structure, and via structures 3222, 3226 are each provided as TOV or TIV structures in the illustrated embodiment.

In one embodiment, semiconductor device 3200 includes a single interconnect structure 3201 having multiple interconnect sections. Each interconnect section can have a same or different size and composition. For example, interconnect structure 3201 can have the following sections to create a single interconnect: single and or multiple submicron via-TSV-via first-via last-single and or multiple submicron via. The interconnect structure 3201 may create thinnest possible active area cross section for a device having three functional sections with two bulk (3220, 220) and one SOI (230) functional section.

Referring now to FIG. 2D, an example multi-layer semiconductor device 4200 includes first silicon layer 210, first section 220, and via joining layer 240. Semiconductor device 4200 also includes second silicon layer 3210, via joining layer 1230, section 260 (here, third section 260), and silicon layer 270 (here, third silicon layer 270). In the illustrated embodiment, semiconductor device 4200 also includes a second section (e.g., a tier-2 functional section) 4210 which has first and second opposing surfaces. The first surface of the second section 4210 is disposed over and coupled to the second surface of the via joining layer 240. Additionally, the second surface of the second section 4210 is disposed beneath and coupled to the second surface of second silicon layer 3210. Second section 4210 includes interconnect pad 4212. Additionally, first section 220, second section 4210 and third section 260 are each fabricated using bulk semiconductor fabrication techniques in the illustrated embodiment.

Semiconductor device 4200 additionally includes an interconnect structure 4201 which extends through each of first silicon layer 210, first section 220, via joining layer 240, second section 4210, second silicon layer 3210, via joining layer 1230, and third section 260. The interconnect structure 4201 includes a plurality of via structures (here, nine via structures).

Interconnect structure 4201 includes via structures 214, 224, 228, and 242. Interconnect structure 4201 also includes via structures 3214, 1232, 264, and 266. Interconnect structure 4201 additionally includes a via structure 4214 which extends from and forms an electrical connection between a second surface of interconnect pad 4212 of second section 4210, and a first surface of interconnect pad 3212 of second silicon layer 3210. Via structure 4214 is provided as a TOV or TIV structure in the illustrated embodiment. In one embodiment, semiconductor device 4200 includes a single interconnect structure 4201 having multiple interconnect sections. Each interconnect section can have a same or different size and composition. For example, interconnect structure 4201 can have following sections to create a single interconnect: single and or multiple submicron via-via first-TSV-via last-via first-single and or multiple submicron via-TSV. The interconnect structure 4201 may create thinnest possible active area cross section for a device having three functional sections (220, 4210, 260) which are each provided as bulk functional sections.

Referring now to FIG. 2E, an example multi-layer semiconductor device 5200 includes first silicon layer 210, first section 220, and via joining layer 240. Semiconductor device 5200 also includes second section 4210 and second silicon layer 3210. In the illustrated embodiment, semiconductor device 5200 also includes a via joining layer 5210 and a third section (e.g., a tier-3 functional section) 5220, each having first and second opposing surfaces. The first surface of the via joining layer 5210 is disposed over and coupled to the second surface of the second silicon layer 3210. Additionally, the first surface of the third section 5220 is disposed over and coupled to the second surface of the via joining layer 5210. Third section 5220 includes interconnect pad 5224. Additionally, first section 220 and second section 4210 are each fabricated using bulk semiconductor fabrication techniques, and third section 5220 is fabricated using at least SOI fabrication techniques in the illustrated embodiment.

Semiconductor device 5200 additionally includes an interconnect structure 5201 which extends through each of first silicon layer 210, first section 220, via joining layer 240, second section 4210, second silicon layer 3210, via joining layer 5210, and third section 5220. The interconnect structure 5201 includes a plurality of via structures (here, seven via structures).

Interconnect structure 5201 includes via structures 214, 224, 228, and 242. Interconnect structure 5201 also includes via structures 4214 and 3214. Interconnect structure 5201 additionally includes a via structure 5222 which extends from and forms an electrical connection between a second surface of interconnect pad 3216 of second silicon layer 3210, and a first surface of interconnect pad 5224 of third section 5220. Via structure 5222 is provided as a TOV or TIV structure in the illustrated embodiment. In one embodiment, semiconductor device 5200 includes a single interconnect structure 5201 having multiple interconnect sections. Each interconnect section can have a same or different size and composition. For example, interconnect structure 5201 can have the following sections to create a single interconnect: via last-TSV-via last-via first-single and or multiple submicron via-TSV. The interconnect structure 5201 may create thinnest possible active area cross section for a device having three functional sections with two bulk (4210, 220) and one SOI (5220) functional section. Semiconductor device 5200 has top and bottom surface (i.e., first and second surfaces) available for flip-chip and/or wire-bonding.

Additionally, in one embodiment, semiconductor device 5200 uses via joining layer 5210 to couple third section 5220 to the rest of the semiconductor device 5200. An example process for coupling third section 5220 with the rest of the semiconductor device 5200 in 3-D integration, for example, may have three requirements. The first requirement may be that the room-temperature bond be sufficiently strong to prevent wafer slippage between wafer alignment and wafer bonding processes, for example, since alignment and a heat treatment (e.g., at between 150 and 300 C) may take place in two separate instruments. Second, in one embodiment, the bond temperatures must not exceed 500 C, which corresponds to an upper limit of an aluminum-based interconnect. Finally, in one embodiment, the bond must be sufficiently strong to withstand the 3-D-fabrication process.

A wafer containing third section 5220 and a wafer containing the rest of the function sections (e.g., 220, 4210) may be coated with about 1500 nm of a low-temperature oxide (LTO) deposited by a low pressure chemical vapor deposition (LPCVD) at a temperature of about 430 C. A bottom surface of third section 5220 and a top surface of second silicon layer 3210 may be coated with LTO. In one embodiment, 1000 nm of the oxide may be removed by CMP to planarize and smooth the surfaces to a roughness of <about 4 angstroms root mean square (rms). The wafer with third section 5220, and the wafer(s) with rest of the functional sections may be immersed in $H_2O_2$ at about 80 C for about 10 mm to remove any organic contaminants and to activate the surfaces with a high density of hydroxyl groups, after which the wafers are rinsed and spun dry in nitrogen in a standard rinse/dryer. The wafers may be precision aligned to sub-micron accuracy using Infrared cameras, for example, to look substantially directly through a top tier substrate. The wafers may also be bonded by initiating contact at the center of a top wafer.

When oxide coated surfaces of third section 5220 and second silicon layer 3210 are brought into contact to create via joining layer 5210, one or more "weak" (−0.45 eV) hydrogen bonds may be created at the interface (Si—OH: HO—Si). The interface (e.g., a bond interface) propagates radially within about 2-5 seconds(s) to the edge of the wafer pair, and after about 30 s, the wafer pair can be removed from an aligner without disturbing the bond and wafer alignment. The bond strength of via joining layer 5210 may be increased by a thermal cycle which creates covalent bonds at the interface from the reaction Si—OH:HO—Si→Si—O—Si+H2O, with the Si—O bond having a bond energy of about 4.5 eV. Optimal thermal cycle parameters for this particular bonding technique were determined by measuring bond strengths in the temperature range of about 150 C-500 C. An about 275 C, 10 hour thermal cycle was chosen as optimum since a surface energy of about 1000 mJ/m2 is required to allow removal of the handle substrate and subsequent processing of via structure 5222 without disturbing the aligned pair.

Referring now to FIG. 2F, an example multi-layer semiconductor device 6200 includes first silicon layer 210, first section 220, and via joining layer 240. Semiconductor device 6200 also includes second silicon layer 3210, via joining layer 5210, and third section 5220. In the illustrated embodiment, semiconductor device 6200 also includes a second section (e.g., a tier-2 functional section) 6210 which has first and second opposing surfaces. The first surface of the second section 6210 is disposed over and coupled to the second surface of the via joining layer 240. Additionally, the second surface of second section 6210 is disposed beneath and coupled to the first surface of second silicon layer 3210. Second section 6210 includes interconnect pads 6212, 6216. Additionally, first section 220 and second section 6210 are each fabricated using bulk semiconductor fabrication techniques, and third section 5220 is fabricated using at least SOI fabrication techniques in the illustrated embodiment.

Semiconductor device 6200 additionally includes an interconnect structure 6201 which extends through each of first silicon layer 210, first section 220, via joining layer 240, second section 6210, second silicon layer 3210, via joining layer 5210, and third section 5220. The interconnect structure 6201 includes a plurality of via structures (here, eight via structures).

Interconnect structure 6201 includes via structures 214, 224, 228, and 242. Interconnect structure 6201 also includes via structures 3214 and 5222. Interconnect structure 6201 additionally includes a via structure 6214 which extends from and forms an electrical connection between a second surface of interconnect pad 6212 of second section 6210, and a first surface of interconnect pad 6216 of second section 6210. Interconnect structure 6201 further includes a via structure 6218 which extends from and forms an electrical connection between a second surface of interconnect pad 6216 of second section 6210, and a first surface of interconnect pad 3212 of second silicon layer 3210. Via structures 6214, 6218 are each provided as TOV or TIV structures in the illustrated embodiment.

In one embodiment, semiconductor device 6200 includes a single interconnect structure 6201 having multiple interconnect sections. Each interconnect section can have a same or different size and composition. For example, interconnect structure 6201 can have the following sections to create a single interconnect: via last-TSV-single and or multiple submicron via-via first-single and or multiple submicron via-TSV. The interconnect structure 6201 may create thinnest possible active area cross section for a device having three functional sections with two bulk (6210, 220) and one SOI (5220) functional section. Semiconductor device 6200 also has top and bottom surfaces (i.e., first and second surfaces) available for flip-chip and/or wirebonding.

Referring now to FIG. 2G, an example multi-layer semiconductor device 7200 includes first silicon layer 210, first section 220, and via joining layer 240. Semiconductor device 7200 also includes via joining layer 1230, third section 260, and silicon layer 270 (here, third silicon layer 270).

In the illustrated embodiment, semiconductor device 7200 also includes a second section (e.g., a tier-2 functional section) 7210 and a second silicon layer 7220, each having first and second opposing surfaces. The first surface of the second section 7210 is disposed over and coupled to the second surface of the via joining layer 240. Additionally, the first surface of the second silicon layer 7220 is disposed over and coupled to the second surface of the second section 7210. Further, the second surface of the second silicon layer 7220 is disposed beneath and coupled to the first surface of via joining layer 1230. Second section 7210 includes interconnect pads 7212, 7216, and second silicon layer 7220 includes interconnect pads 7222, 7226. Additionally, first section 220, second section 7210, and third section 260 are each fabricated using bulk semiconductor fabrication techniques in the illustrated embodiment.

Semiconductor device 7200 additionally includes an interconnect structure 7201 which extends through each of first silicon layer 210, first section 220, via joining layer 240, second section 7210, second silicon layer 7220, via joining layer 1230, and third section 260. The interconnect structure 7201 includes a plurality of via structures (here, ten via structures).

Interconnect structure 7201 includes via structures 214, 224, 228, and 242. Interconnect structure 7201 also includes via structures 1232, 264 and 266. Interconnect structure 7201 additionally includes a via structure 7214 which extends from and forms an electrical connection between a second surface of interconnect pad 7212 of second section 7210, and a first surface of interconnect pad 7216 of second section 7210. Interconnect structure 7201 further includes a via structure 7218 which extends from and forms an electrical connection between a second surface of interconnect pad 7216 of second section 6210, and a first surface of interconnect pad 7222 of second silicon layer 7220. Interconnect structure 7201 also includes a via structure 7224 which extends from and forms an electrical connection between a second surface of interconnect pad 7222 of second silicon layer 7220, and a first surface of interconnect pad 7226 of second silicon layer 7220. Via structures 7214, 7218 are each provided as TOV or TIV structures, and via structure 7224 is provided as a TSV structure in the illustrated embodiment.

In one embodiment, semiconductor device 7200 includes a single interconnect structure 7201 having multiple interconnect sections. Each interconnect section can have a same or different size and composition. For example, interconnect structure 7201 can have the following sections to create a single interconnect: single and or multiple submicron via-via first-TSV-single and or multiple submicron via-via first-single and or multiple submicron via-TSV. The interconnect structure 7201 may create thinnest possible active area cross section for a device having three functional sections with all three sections being bulk (260, 7210, 220) functional section.

Referring now to FIG. 2H, an example multi-layer semiconductor device 8200 includes silicon layer 2210 (here, first silicon layer 2210), first section 220, and via joining layer 240. In the illustrated embodiment, semiconductor device 8200 also includes a second silicon layer 8210, a second section (e.g., a tier-2 functional section) 8220, and a third section (e.g., a tier-3 functional section) 8230, each having first and second opposing surfaces.

The first surface of the second silicon layer 8210 is disposed over and coupled to the second surface of the via joining layer 240. Additionally, the first surface of second section 8220 is disposed over and coupled to the second surface of the second silicon layer 8210. Further, the first surface of third section 8230 is disposed over and coupled to the second surface of the second section 8220. Second silicon layer 8210 includes interconnect pads 8212, 8216, second section 8220 includes interconnect pad 8224, and third section 8230 includes interconnect pads 8232, 8236. Additionally, first section 220 and second section 8220 are each fabricated using bulk semiconductor fabrication techniques, and third section 8230 is fabricated using at least SOI techniques in the illustrated embodiment.

Semiconductor device 8200 additionally includes an interconnect structure 8201 which extends through each of first section 220, via joining layer 240, second silicon layer 8210, second section 8220, and third section 8230. The interconnect structure 8201 includes a plurality of via structures (here, seven via structures).

Interconnect structure 8201 includes via structures 224, 228, and 242. Interconnect structure 8201 also includes a via structure 8214 which extends from and forms an electrical connection between a second surface of interconnect pad 8212 of second silicon layer 8210, and a first surface of interconnect pad 6216 of second silicon layer 8210. Interconnect structure 8201 additionally includes a via structure 8222 which extends from and forms an electrical connection between a second surface of interconnect pad 8216 of second silicon layer 8210, and a first surface of interconnect pad 8224 of second section 8220.

Interconnect structure 8201 further includes a via structure 8226 which extends from and forms an electrical connection between a second surface of interconnect pad 8224 of second section 8220, and a first surface of interconnect pad 8232 of third section 8230. Interconnect structure 8201 also includes a via structure 8234 which extends from and forms an electrical connection between a second surface of interconnect pad 8232 of third section 8230, and a first surface of interconnect pad 8236 of third section 8230. Via structures 8222, 8226, and 8234 are each provided as TOV or TIV structures, and via structure 8214 is provided as a TSV structure in the illustrated embodiment. In one embodiment, semiconductor device 8200 includes a single interconnect structure 8201 having multiple interconnect sections. Each interconnect section can have a same or different size and composition. For example, interconnect structure 8201 can have the following sections to create a single interconnect: via last-single and/or multiple submicron via-TSV-via first-single and/or multiple submicron via. The interconnect structure 8201 may create thinnest possible active area cross section for a device having three functional sections with two bulk (8220, 220) and one SOI (8230) functional section.

Referring now to FIG. 2I, an example multi-layer semiconductor device 9200 includes first silicon layer 2210, first section 220, and second section 230. Semiconductor device 9200 also includes via joining layer 240, second silicon layer 8210, section 8220 (here, third section 8220), and section 8230 (here, fourth section 8230). First section 220 and third section 8220 are each fabricated using bulk semiconductor fabrication techniques in the illustrated embodiment. Additionally, second section 230 and third section 8230 are each fabricated using at least SOI techniques in the illustrated embodiment.

Semiconductor device 9200 additionally includes an interconnect structure 9201 which extends through each of first section 220, second section 230, via joining layer 240, second silicon layer 8210, third section 8220, and fourth section 8230. The interconnect structure 9201 includes a plurality of via structures (here, eight via structures).

Interconnect structure 9201 includes via structures 224, 228, 234, and 242. Interconnect structure 9201 also includes via structures 8214, 8222, 8226, and 8234. In one embodiment, semiconductor 9200 includes a single interconnect structure 9201 having multiple interconnect sections. Each interconnect section can have a same or different size and composition. For example, interconnect structure 9201 can have following sections to create a single interconnect: via last-single and or multiple submicron via-TSV-via first-via last-single and or multiple submicron via. The interconnect structure 9201 may create thinnest possible active area cross section for a device having four functional sections with two bulk (8220, 220) and two SOI (8230, 230) functional sections.

Referring now to FIG. 2J, an example multi-layer semiconductor device 10200 includes first silicon layer 210, first section 220, and second section 230. Semiconductor device 10200 also includes via joining layer 240, third section 250, and fourth section 260. In the illustrated embodiment, semiconductor device 10210 additionally includes silicon layer 10210 (here, second silicon layer 10210). The first surface of the second silicon layer 10210 is disposed over and coupled to the second surface of the fourth section 260. Second silicon layer 10210 includes interconnect pad 10214. First section 220 and fourth section 260 are each fabricated using bulk semiconductor fabrication techniques in the illustrated embodiment. Additionally, second section 230 and third section 250 are each fabricated using at least SOI techniques in the illustrated embodiment.

Semiconductor device 10200 additionally includes an interconnect structure 10201 which extends through each of first silicon layer 210, first section 220, second section 230, via joining layer 240, third section 250, fourth section 260, and second silicon layer 10210. The interconnect structure 10201 includes a plurality of via structures (here, nine via structures).

Interconnect structure 10201 includes via structures 214, 224, 228, and 234. Interconnect structure 10201 also includes via structures 242, 254, 264, and 266. Interconnect structure 10201 additionally includes a via structure 10212 which extends from and forms an electrical connection between a second surface of interconnect pad 267 of fourth section 260, and a first surface of interconnect pad 10214 of second silicon layer 10210. Via structure 10212 is provided as a TSV structure in the illustrated embodiment.

Semiconductor device 10200 includes a single interconnect structure 10201 having multiple interconnect sections. Each interconnect section can have a same or different size and composition. For example, interconnect structure 10201 can have the following sections to create a single interconnect: TSV-single and or multiple submicron via-via last-via first-via last-single and or multiple submicron via-TSV. The interconnect structure 10201 may create thinnest possible active area cross section for a device having four functional sections with two bulk (260, 220) and two SOI (230,250) functional sections. Semiconductor device 10200 has top and bottom surface (i.e., first and second surfaces) available for flip-chip and/or wirebonding. Although various single interconnects are illustrated in FIGS. 2-2J, it is further possible that parts of these interconnects can be used for electrical interconnects for device functions.

As described above and will be appreciated by one of skill in the art, embodiments of the disclosure herein may be configured as a system, method, or combination thereof. Accordingly, embodiments of the present disclosure may be comprised of various means including hardware, software, firmware or any combination thereof. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

It is to be appreciated that the concepts, systems, circuits and techniques sought to be protected herein are not limited to use in a particular application (e.g., filter circuitry in mobile phones, tablets, digital cameras and the like). In contrast, the concepts, systems, circuits and techniques sought to be protected herein may be found useful in substantially any application where a semiconductor manufacturer desires to fabricate semiconductor sections, structures and devices having a thinnest possible active area cross section in comparison to conventional semiconductor sections, structures and devices.

An active area of the semiconductor device has been defined as part of the semiconductor device which contains active and/or passive circuits that are used during device operation. An active area does not consider handle Si which is typically used for mechanical support. FIGS. 2-2J, for example, illustrates semiconductor devices with various combinations of bulk and SOI functional sections. Additionally, FIGS. 2-2J illustrate options to create semiconductor devices with various combinations (e.g., random combinations) of bulk and SOI functional sections placed in the semiconductor device while maintaining a thinnest possible active are cross section by using smallest possible interconnect to electrically connect substantially the entire semiconductor device from top to bottom (i.e., from the first surface to the second surface of the semiconductor device).

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

The invention claimed is:
1. A multi-layer semiconductor device, comprising:
two or more functional semiconductor sections, each of the functional semiconductor sections having first and second opposing surfaces and consisting of:

at least one insulating layer having a first surface corresponding to the first surface of said functional semiconductor section and having a second opposing surface; and
at least one device layer having a first surface disposed on the second surface of said insulating layer and having a second opposing surface corresponding to the second surface of said functional semiconductor section each of said at least one device layers including at least one circuit device; and
a plurality of first conductive via structures coupled to at least one of said at least one circuit devices so as to form one or more electrical connections extending between the first and second surfaces of said device layer;
one or more second conductive via structures extending through at least a portion of at least one of the two or more functional semiconductor sections, and electrically coupled to select ones of the electrical connections in the at least one of the two or more functional semiconductor sections, the second conductive structures provided as one of: a through oxide via (TOV) structure; or a through insulator via (TIV) structure;
one or more silicon layers having first and second opposing surfaces, wherein at least a first one of the silicon layers includes at least one through silicon via (TSV) structure which extends between the first and second surfaces of the first one of the silicon layers, and is electrically coupled to at least one of the second conductive via structures to form one or more electrical connections between the first one of the silicon layers and one or more of the functional semiconductor sections; and
a via joining layer disposed between and coupled to two of the functional semiconductor sections, said via joining layer including:
at least one fourth conductive via structure extending between first and second surfaces of the via joining layer, wherein the at least one fourth conductive via structure is disposed to form one or more electrical connections between the two functional semiconductor sections.

2. The semiconductor device of claim 1 wherein:
the first conductive via structures are provided as one of: a through oxide via (TOV) structure; or a through insulator via (TIV) structure; and
at least one of the at least one fourth conductive via structure includes at least one of:
a submicron via provided as a via-first TSV; and
a submicron via provided as a via-last TSV.

3. The semiconductor device of claim 1 wherein the at least one fourth conductive via structure is provided as one of: a through oxide via (TOV) structures; or a through insulator via (TIV) structure.

4. The semiconductor device of claim 1 wherein first select ones of the first conductive via structures, first select ones of the second conductive via structures, the at least one third conductive via structure, and the at least one fourth conductive via structure are electrically coupled to form an interconnect structure which extends through each of semiconductor sections, each of the via joining layers and the first one of the silicon layers.

5. The semiconductor device of claim 1 wherein the semiconductor device comprises three functional semiconductor sections, wherein:

the first surface of a first one of the three functional semiconductor sections is disposed over and coupled to the second surface of the first one of the silicon layers;
the first surface of a second one of the semiconductor sections is disposed over and coupled to the second surface of the first one of the semiconductor sections; and
a first one of the via joining layers is disposed between and coupled to the second surface of the second one of the semiconductor sections and the second surface of a third one of the semiconductor sections.

6. The semiconductor device of claim 5 wherein the functional semiconductor sections comprises a second conductive via structure which extends from and forms an electrical connection between first select ones of the electrical connections in the first one of the functional semiconductor sections, first select ones of the electrical connections in the second one of the functional semiconductor sections, and the second surface of the second one of the functional semiconductor sections, wherein the second conductive structure is electrically coupled to the at least one fourth conductive via structure in the first one of the via joining layers.

7. The semiconductor device of claim 5 wherein the first and third ones of the functional semiconductor sections are each fabricated using bulk semiconductor fabrication techniques, and the second one of the functional semiconductor sections is fabricated using at least Silicon-On-Insulator (SOI) fabrication techniques.

8. The semiconductor device of claim 5 wherein the first one of the functional semiconductor sections and the second one of the functional semiconductor sections are each provided as part of a first semiconductor structure, the third one of the semiconductor sections is provided as part of a second semiconductor structure, and the first one of the via joining layers electrically couples the second semiconductor structure to the first semiconductor structure.

9. The semiconductor device of claim 5 wherein the second one of the functional semiconductor sections is electrically coupled to the first one of the functional semiconductor sections using via-last techniques.

10. The semiconductor device of claim 9 wherein the third one of the functional semiconductor sections is electrically coupled to the second one of the functional semiconductor sections using via-first techniques.

11. The semiconductor device of claim 1 wherein the first and second surfaces of the functional semiconductor sections each include or are coated with a bondable dielectric material.

12. The semiconductor device of claim 1 wherein a predetermined distance of between about eight micrometers ($\mu$m) and about twelve $\mu$m exists between the first and second surfaces of the first one of the silicon layers, wherein the predetermined distance corresponds to a height of the first one of the silicon layers.

13. The semiconductor device of claim 1 wherein a predetermined distance of between about six $\mu$m and about eight $\mu$m exists between the first and second surfaces of each of the semiconductor sections, wherein the predetermined distance corresponds to a height of the semiconductor sections.

14. The semiconductor device of claim 1 wherein a predetermined distance of between about one $\mu$m and about three $\mu$m exists between the first and second surface of each of the via joining layers, wherein the predetermined distance corresponds to a height of the via joining layers.

15. The semiconductor device of claim 1 wherein a second one of the silicon layers includes at least one third conductive via structure which extends between select portions of the first and second surfaces of the second one of the silicon layers.

16. The semiconductor device of 16 wherein the semiconductor device comprises four functional semiconductor sections, wherein:
the first surface of a first one of the functional semiconductor sections is disposed over and coupled to the second surface of the first one of the silicon layers;
the first surface of a second one of the functional semiconductor sections is disposed over and coupled to the second surface of the first one of the functional semiconductor sections;
a first one of the via joining layers is disposed between and coupled to the second surface of the second one of the functional semiconductor sections and the first surface of the second one of the silicon layers; and
a second one of the via joining layers is disposed between and coupled to the first surface of the third one of the functional semiconductor sections and the second surface of a fourth one of the functional semiconductor section.

17. A method for fabricating a multi-layer semiconductor device, comprising:
providing two or more semiconductor sections, each of the semiconductor sections having first and second opposing surfaces and including:
at least one insulating layer having first and second opposing surfaces; and
at least one device layer having first and second opposing surfaces and a plurality of electrical connections extending between the first and second surfaces, the electrical connections corresponding to first conductive structures;
forming second conductive structures, each of the second conductive structures extending through at least a portion of at least one of the semiconductor sections, and electrically coupled to select ones of the electrical connections in the at least one of the semiconductor sections, the second conductive structures provided as through oxide via (TOV) or through insulator via (TIV) structures;
providing one or more silicon layers having first and second opposing surfaces, wherein at least a first one of the silicon layers includes at least one third conductive structure which extends between select portions of the first and second surfaces of the first one of the silicon layers, and is electrically coupled to at least one of the second conductive structures to form one or more electrical connections between the first one of the silicon layers and one or more of the semiconductor sections, the at least one third conductive structure provided as a through silicon via (TSV) structure; and
providing one or more via joining layers, each of the via joining layers disposed between and coupled to a select two of the semiconductor sections, a select two of the silicon layers, or a select one of the semiconductor sections and a select one of the silicon layers, each of the via joining layers having first and second opposing surfaces and including:
at least one fourth conductive structure extending between select portions of the first and second surfaces of the via joining layer, wherein the at least one fourth conductive structure is electrically coupled to the select two of the semiconductor sections, the select two of the silicon layers, or the select one of the semiconductor sections and the select one of the silicon layers to form one or more electrical connections between the select two of the semiconductor sections, the select two of the silicon layers, or the select one of the semiconductor sections and the select one of the silicon layers.

18. The method of claim 17 further comprising:
electrically coupling first select ones of the first conductive structures, first select ones of the second conductive structures, the at least one third conductive structure, and the at least one fourth conductive structure to form an interconnect structure which extends through each of semiconductor sections, each of the via joining layers and the first one of the silicon layers.

19. The method of claim 17 wherein providing two or more semiconductor sections comprises:
providing two or more semiconductor sections, each of the semiconductor sections having first and second opposing surfaces and including:
at least one insulating layer having first and second opposing surfaces; and
at least one device layer having first and second opposing surfaces and a plurality of electrical connections extending between the first and second surfaces, the electrical connections corresponding to first conductive structures, wherein first select ones of the semiconductor sections are fabricated using bulk semiconductor fabrication techniques and second select ones of the semiconductor sections are fabrication using at least Silicon-On-Insulator (SOI) fabrication techniques.

20. A multi-layer semiconductor device, comprising:
one or more functional semiconductor sections, each of the one or more functional semiconductor sections having first and second opposing surfaces, and at least one of the one or more functional semiconductor sections including:
a through silicon via (TSV) extending between the first and second surfaces of the at least one of the one or more functional semiconductor sections, the TSV structure including:
a plurality of metal layers, wherein at least one of the metal layers has at least one low temperature melt metal and/or alloy which melts and flows during processing and/or bonding of the at least one of the functional semiconductor sections, the at least one low temperature melt metal and/or alloy capable of repairing openings and/or defects which may be in the TSV structure, and the at least one low temperature melt metal and/or alloy capable of melting and/or reacting with at least a second metal in the TSV structure to create a third conductive composition having a melting point characteristic which is higher than a melting point characteristic of the low temperature melt metal and/or alloy, the third conductive composition having a coefficient of thermal expansion (CTE) which is greater than a CTE of the second metal.

21. The semiconductor device of claim 20 wherein the low temperature melt metal and/or alloy is a conductive fusible metal.

22. The semiconductor device of claim 20 wherein the second metal is at least one of Copper (Cu), Silver (Ag), or Gold (Au).

23. A multi-layer semiconductor device, comprising:
(a) a silicon layer having first and second opposing surfaces and comprising at least one conductive via structure which extends between the first and second surfaces of said silicon layer;
(b) a first functional semiconductor section having a first surface disposed over the second surface of said silicon layer and having a second opposing surface, said first functional semiconductor section comprising:
  (1) a first device layer having a first surface corresponding to the first surface of said first functional section having a second opposing surface, said first device layer having at least one circuit device therein;
  (2) an insulating layer having a first surface disposed over the second surface of said first device layer and having a second opposing surface;
  (3) a first plurality of conductive via structures provided in said first device layer and extending between the first and second surfaces of said first device layer and electrically coupled to at least one conductive via structure of said silicon layer;
(c) a second functional semiconductor section having a first surface disposed on the second surface of said first functional semiconductor section and having a second opposing surface, said second functional semiconductor section comprising:
  (1) a second insulating layer having a first surface corresponding to the first surface of said second functional semiconductor section and having a second opposing surface;
  (2) a second device layer having a first surface disposed on the second surface of said insulating layer and having a second opposing surface, said first device layer having at least one circuit device therein;
  (3) a second plurality of conductive via structures provided in said second device layer and extending between the first and second surfaces of said second device layer;
(d) a third plurality of conductive via structures extending through at least a portion of said first and second functional semiconductor sections, and electrically coupled to select ones of the at least one circuit devices in the functional semiconductor sections, the third conductive via structures provided as one of:
  (1) a through oxide via (TOV) structure; or
  (2) a through insulator via (TIV) structure.
24. The multi-layer semiconductor device of claim 23 further comprising:
(e) a third functional semiconductor section having first and second opposing surfaces, said third functional semiconductor section comprising:
  (1) a third insulating layer having a first surface corresponding to the first surface of said third functional semiconductor section and having a second opposing surface;
  (2) a third device layer having a first surface disposed on the second surface of said insulating layer and having a second opposing surface and having at least one circuit device provided therein; and
  (3) a third plurality of conductive via structures provided in said third device layer and extending between the first and second surfaces of said second device layer; and
(f) a via joining layer disposed between the first surface of said third functional semiconductor section and the second surface of said second functional semiconductor section; and
(g) a fourth plurality of conductive via structures provided in said joining layer and extending between the first and second surfaces of said via joining layer, wherein at least one of said fourth plurality of conductive via structures electrically couples at least one circuit device on the second functional semiconductor section to at least one circuit device on the third functional semiconductor section.

25. The multi-layer semiconductor device of claim 24 wherein at least one of the first plurality of conductive via structures in the first device layer is provided as at least one of:
  a submicron via provided as a via-first through-silicon-via (TSV); and
  a submicron via provided as a via-last TSV.

26. The multi-layer semiconductor device of claim 25 further comprising bonding section provided from a self-bondable oxide.

27. The multi-layer semiconductor device of claim 26 further comprising:
(h) a second silicon layer having a first surface disposed over a second surface of said third functional semiconductor section, wherein said second silicon layer includes at least one conductive via structure which extends between the first and second surfaces thereof and is electrically coupled to at least one of the at least one circuit devices provided in said third device layer of said third functional semiconductor section.

28. The multi-layer semiconductor device of claim 27 wherein the at least one third conductive via structure provided as a through-silicon-via (TSV) structure.

* * * * *

UNITED STATES PATENT AND TRADEMARK OFFICE
CERTIFICATE OF CORRECTION

PATENT NO. : 9,881,904 B2
APPLICATION NO. : 15/303800
DATED : January 30, 2018
INVENTOR(S) : Rabindra N. Das et al.

It is certified that error appears in the above-identified patent and that said Letters Patent is hereby corrected as shown below:

Column 11, Line 5, delete "semiconductor (CMOS))" and replace with --semiconductor (CMOS)--.

Column 12, Line 17, delete "e.g., .g., Cu" and replace with --(e.g., Cu--.

Column 14, Line 5-6, delete "conductive structure 137"" and replace with --conductive structure 137'"--.

Column 15, Line 21, delete "conductive structure 141"" and replace with --conductive structure 141'"--.

Column 29, Line 53, delete "Cu(10% or less)," and replace with --Cu (10% or less),--.

Signed and Sealed this
Eighth Day of January, 2019

Andrei Iancu
*Director of the United States Patent and Trademark Office*